(12) United States Patent
Ohashi et al.

(10) Patent No.: US 11,295,935 B2
(45) Date of Patent: Apr. 5, 2022

(54) ELECTROMAGNET DEVICE, ELECTROMAGNET CONTROLLER, ELECTROMAGNET CONTROL METHOD, AND ELECTROMAGNET SYSTEM

(71) Applicant: EBARA CORPORATION, Tokyo (JP)

(72) Inventors: Tomonori Ohashi, Tokyo (JP); Toshimitsu Barada, Tokyo (JP); Hironobu Yamasaki, Tokyo (JP); Misako Kudo, Tokyo (JP); Ichiju Sato, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 795 days.

(21) Appl. No.: 15/572,319

(22) PCT Filed: May 9, 2016

(86) PCT No.: PCT/JP2016/063698
§ 371 (c)(1),
(2) Date: Nov. 7, 2017

(87) PCT Pub. No.: WO2016/181919
PCT Pub. Date: Nov. 17, 2016

(65) Prior Publication Data
US 2018/0114678 A1    Apr. 26, 2018

(30) Foreign Application Priority Data

May 11, 2015  (JP) .................................. 2015-096248
May 28, 2015  (JP) .................................. 2015-108160
Oct. 27, 2015  (JP) ............................. JP2015-210872

(51) Int. Cl.
*H01H 47/00*    (2006.01)
*H01J 37/32*    (2006.01)
(Continued)

(52) U.S. Cl.
CPC .... *H01J 37/32669* (2013.01); *C23C 14/3407* (2013.01); *C23C 14/35* (2013.01);
(Continued)

(58) Field of Classification Search
CPC .......... H01J 37/32669; H01J 37/32091; H01J 37/32642; H01L 21/67069; H01L 21/3065; H01F 7/064; H01F 7/20
(Continued)

(56) References Cited

U.S. PATENT DOCUMENTS 3,710,437 A * 1/1973 Kipple ................... H02K 15/12
29/596
5,017,102 A * 5/1991 Shimaguchi .......... F04D 13/027
417/420
(Continued)

FOREIGN PATENT DOCUMENTS

CN    102364619 A    2/2012
CN    102577631 A    7/2012
(Continued)

OTHER PUBLICATIONS

International Search Report issued in Patent Application No. PCT/JP2016/063698 dated Aug. 9, 2016.
(Continued)

*Primary Examiner* — Jared Fureman
*Assistant Examiner* — Lucy M Thomas
(74) *Attorney, Agent, or Firm* — Pearne & Gordon LLP

(57) ABSTRACT

The electromagnet device of the present invention comprises: a yoke having an annular groove in a front surface thereof; an annular coil provided in the groove; and an epoxy resin provided on an outer surface of the coil configured to secure the coil to the yoke, wherein there is a clearance
(Continued)

between an outer circumferential surface of the groove in the yoke and the epoxy resin provided on an radially outer side of the coil.

8 Claims, 20 Drawing Sheets

(51) Int. Cl.
| | |
|---|---|
| *C23C 14/35* | (2006.01) |
| *H01L 21/3065* | (2006.01) |
| *C23C 14/34* | (2006.01) |
| *G01R 19/165* | (2006.01) |
| *H01F 7/06* | (2006.01) |
| *H01F 7/20* | (2006.01) |
| *H01F 13/00* | (2006.01) |
| *H01F 27/22* | (2006.01) |

(52) U.S. Cl.
CPC ....... *G01R 19/16528* (2013.01); *H01F 7/064* (2013.01); *H01F 7/20* (2013.01); *H01F 13/006* (2013.01); *H01F 27/22* (2013.01); *H01L 21/3065* (2013.01); *H01J 2237/334* (2013.01)

(58) Field of Classification Search
USPC ......................................................... 361/140
See application file for complete search history.

(56) References Cited

U.S. PATENT DOCUMENTS

| | | | |
|---|---|---|---|
| 2011/0115379 A1 | 5/2011 | Long et al. | |
| 2011/0309906 A1 | 12/2011 | Muneuchi et al. | |
| 2012/0092108 A1* | 4/2012 | Prabhakaran | H01F 27/32 336/55 |
| 2014/0206199 A1 | 7/2014 | Himori et al. | |
| 2014/0346040 A1 | 11/2014 | Yokota et al. | |
| 2017/0004956 A1* | 1/2017 | Yasuda | H01J 37/32642 |
| 2017/0018407 A1* | 1/2017 | Kondo | H01J 37/32642 |

FOREIGN PATENT DOCUMENTS

| | | |
|---|---|---|
| JP | S54-090492 S | 7/1979 |
| JP | S60-098822 A | 6/1985 |
| JP | H02-195294 A | 8/1990 |
| JP | H05-267237 A | 10/1993 |
| JP | H06-335226 A | 12/1994 |
| JP | H07-072277 A | 3/1995 |
| JP | H08-321423 A | 12/1996 |
| JP | 2001-165343 A | 6/2001 |
| JP | 2002-164229 A | 6/2002 |
| JP | 2007-132902 A | 5/2007 |
| JP | 2012-074972 A | 4/2012 |
| JP | 2012-149618 A | 8/2012 |
| JP | 2013-102098 A | 5/2013 |
| JP | 2013-149722 A | 8/2013 |
| JP | 5501181 B2 | 5/2014 |
| JP | 2014-158005 A | 8/2014 |
| JP | 2015-011836 A | 1/2015 |

OTHER PUBLICATIONS

Written Opinion issued in Patent Application No. PCT/JP2016/063698 dated Aug. 9, 2016.

* cited by examiner

|       | 241a | 241b | 241c | 241d |
|-------|------|------|------|------|
| 241a  | 1    | A    | B    | C    |
| 241b  | D    | 1    | E    | F    |
| 241c  | G    | H    | 1    | I    |
| 241d  | J    | K    | L    | 1    |

$$\begin{bmatrix} I''a \\ I''b \\ I''c \\ I''d \end{bmatrix} = \begin{bmatrix} 1 & A & B & C \\ D & 1 & E & F \\ G & H & 1 & I \\ J & K & L & 1 \end{bmatrix} \begin{bmatrix} I'a \\ I'b \\ I'c \\ I'd \end{bmatrix}$$

ELECTROMAGNET DEVICE, ELECTROMAGNET CONTROLLER, ELECTROMAGNET CONTROL METHOD, AND ELECTROMAGNET SYSTEM

TECHNICAL FIELD

The present invention relates to an electromagnet device used, for example, to control the distribution of plasma density in a plasma processing device.

The present invention relates to an electromagnet controller and an electromagnet control method used, for example, to control the distribution of plasma density in a plasma processing device or the like.

The present invention relates to a technology (an electromagnet device, an electromagnet controller, an electromagnet control method, and an electromagnet system) for controlling electric current applied to a coil of an electromagnet having a yoke and the coil.

BACKGROUND ART

It is known that conventional plasma processing devices, such as plasma etching devices, control the distribution of density of plasma generated in the chamber, using magnetic field generated by an electromagnet device. More specifically, in a plasma etching device, for example, Lorentz force is generated by applying electric fields and magnetic fields perpendicular to each other in the chamber filled with etching gas. This Lorentz force sets electrons in drift motion, and the electrons are caught in the magnetic field lines. This in turn causes the electrons and the molecules and atoms in etching gas to collide more frequently, resulting in dense plasma. This is also called magnetron discharge.

Known examples of electromagnet devices used with such plasma processing devices are electromagnets (see, e.g., Patent Literature 1) having a rod-shaped yoke made of iron core and a coil wound around it, and electromagnets having a plate-like yoke and a coil disposed in an annular groove formed in the yoke.

Plasma processing devices, such as plasma etching devices, control the magnetic field generated by a magnet disposed outside the chamber to control the distribution of plasma density in the chamber. It is known that such magnetic field is manipulated, for example, by mechanically moving a permanent magnet or by controlling electric current applied to the electromagnet. However, with the method that mechanically moves the permanent magnet, the intensity of magnetic field generated by the permanent magnetic stays unvaried. This makes it difficult to finely adjust the distribution of plasma density. For this reason, control of electric current applied to the electromagnet is conventionally employed.

The method of controlling the electric current applied to the electromagnet is known to detect the electric current flowing through the coil of the electromagnet, compare the detected electric current value and a target electric current value, and to control the electric current value applied to the coil of the electromagnet to the target electric current value (see, e.g., Patent Literature 2).

Etching methods utilizing magnetron discharge, using plasma processing devices (e.g., plasma etching devices), are conventionally put into practice. In such a method, electric and magnetic fields perpendicular to each other are applied in the chamber filled with etching gas. This sets the electrons in drift motion that is used to etch a wafer surface efficiently.

Such an etching device controls magnetic field generated by a magnet disposed outside the chamber to control the distribution of plasma density in the chamber. It is known that such magnetic field is controlled, for example, by mechanically moving a permanent magnet or by controlling electric current applied to the electromagnet. However, with the method that mechanically moves the permanent magnet, the intensity of magnetic field generated by the permanent magnetic stays unvaried. This makes it difficult to finely adjust the distribution of plasma density. For this reason, control of electric current applied to the electromagnet is conventionally employed (e.g., Patent Literature 2 listed below).

On the other hand, it is known that in the electromagnet, magnetic hysteresis (hereinafter also referred to simply as hysteresis) may occur between the controlled electric current value applied to the electromagnet and the density of resulting magnetic flux. Since the density of magnetic flux resulting from the application of current applied to the electromagnet is affected by residual magnetic field, the same magnetic flux density may not necessarily be reproduced by the same current applied.

One method for reducing such influence of residual magnetic field is to use for a yoke a soft magnetic material (e.g., pure-iron-based material or electromagnetic steel sheet) having a significantly low hysteresis loss. Use of such material makes it possible to consistently provide a magnetic flux density within a certain tolerance for the same electric current applied. Another method for reducing the influence of residual magnetic field is to correct an electric current value by taking hysteresis characteristics into account (e.g., Patent Literature 3 listed below).

CITATION LIST

Patent Literature

Patent Literature 1: JP-A-2013-149722
Patent Literature 2: JP-A-2012-74972
Patent Literature 3: JP-A-2007-132902

SUMMARY OF INVENTION

Technical Problem

Electromagnet devices having a coil disposed in an annular groove in a plate-like yoke have the coil fixed in the groove, for example, by a thermosetting resin or the like. Such thermosetting resin thermally contracts when its temperature drops from high to normal temperature during thermosetting reaction and curing. This contraction of thermosetting resin deforms the yoke. With the yoke so deformed, magnetic fields generated in the chamber of the plasma processing device are not uniform over a plane of an object to be processed, i.e., a substrate, causing the problem that substrates cannot be processed uniformly.

The present invention is made to solve this problem. An object of the present invention is to provide an electromagnet device that prevents yoke deformation.

In controlling electric current applied to the electromagnet as described above, proportional integral (PI) control has been used. In general, such PI control is known to cause a deviation in response to a command value. To bring the electric current through the electromagnet toward a command value promptly, it is necessary to set a comparatively large value for a proportional gain or an integration constant of the PI control. However, setting the proportional gain or integration constant relatively high would reduce stability margin in the PI control, which may cause an overshoot of electric current. Any instrumental errors or a change in the properties of a control system or the electromagnet may cause control instability.

The present invention is made to solve this problem. An object of the present invention is to provide an electromagnet controller and an electromagnet control method that brings the electric current flowing through the electromagnet toward a command value relatively promptly.

For the method using a soft magnetic material in a yoke, the soft magnetic material increases in cost with increasing performance and puts limitations on the shape to be machined and the size of base material. This make it impossible to avoid the problems of limited availability and increased manufacturing cost.

The conventional method of correcting an electric current value by taking hysteresis characteristics into account is difficult to apply to plasma processing devices. Patent Literature 3, for example, teaches that the electric current is controlled to vary cyclically between predetermined maximum and minimum values. In such control, the electric current value is corrected using a function that takes hysteresis characteristics into account. The plasma processing device, on the other hand, controls the electric current value on a non-regular basis to provide a magnetic flux density suitable for given processing conditions. This means that the amount of residual magnetic field to be taken into account varies with the conditions. In other words, the technique taught in Patent Literature 3 cannot be used without modification for plasma controllers.

For this reason, it is desirable to develop a technique for controlling electromagnets that keeps phenomena within a tolerance that may lead plasma processing devices to a reduction in repeatability and individual differences in devices. It is also desirable that such a technique serves to reduce computational load, cost, and/or the time required to receive an electromagnet controller after ordering it. It is also desirable to improve accuracy in control of magnetic flux density output, using the same yoke material.

Solution to Problem

The present invention is made to solve the above-noted problem at least to some extent. The following are possible embodiments.

The electromagnet device according to one aspect of the invention is one that is used with a plasma processing device, comprising: a yoke having an annular groove in its front surface; an annular coil disposed in the groove; and resin disposed to enclose the coil therein and secure the coil to the yoke and to transfer heat, wherein there is a clearance between an outer circumferential surface of the groove of the yoke and the resin provided on an radially outward side of the coil.

The electromagnet controller according to one aspect of the present invention is one for controlling electric current supplied to an excitation coil of an electromagnet, comprising: a driver for applying electric current to the excitation coil; an electric-current value receiver for receiving a signal indicating an electric current value flowing through the excitation coil; and an electric-current controller for controlling the electric current flowing through the excitation coil, wherein the electric-current controller comprises: an output voltage command calculator for calculating an output voltage command value for applying to the excitation coil a target electric current preset, based on the resistance value of the excitation coil; an electric-current difference calculator for calculating a difference between the target electric current value and an electric current value indicated by a signal received by the electric-current value receiver; and an adder for adding the electric-current difference to the output voltage command value, wherein the electric-current controller transmits the output voltage command value with the electric-current difference added thereto, to the driver.

The electromagnet control method according to one aspect of the present invention is one that controls the electric current applied to an excitation coil of an electromagnet, comprising: determining or calculating an output voltage command value for applying a target electric current to the excitation coil, based on the resistance value of the excitation coil; applying the electric current to the excitation coil, based on the output voltage command value determined; obtaining a signal indicating the electric current value flowing through the excitation coil; determining or calculating the difference between the target electric current value and the electric current value indicated by the signal obtained; adding the electric-current difference to the output voltage command value determined; and applying the electric current to the excitation coil on the basis of the output voltage command value with the electric current difference added thereto.

One aspect of the present invention is to provide an electromagnet controller for controlling the electric current applied to a coil of an electromagnet having a yoke and a coil. This electromagnet controller comprises: a command receiver for receiving a magnetic flux density command value corresponding to a target magnetic flux density value obtained by applying electric current to the coil or information from which the magnetic flux density command value can be identified; and an electric-current determiner for determining a value of electric current applied to the coil, based on the magnetic flux density command value. The electric-current determiner carries out: a first process of determining a value of electric current applied to the coil, based on a first function, when increasing the absolute value of a magnetic flux density from a degaussed state of the yoke; a second process of determining a value of electric current applied to the coil, based on a second function, when decreasing the absolute value of a magnetic flux density from a magnetized state of the yoke; and a third process of determining a value of electric current applied to the coil, based on a third function, when increasing the absolute value of a current flux density from the magnetized state of the yoke.

DESCRIPTION OF EMBODIMENTS

Figure 1:
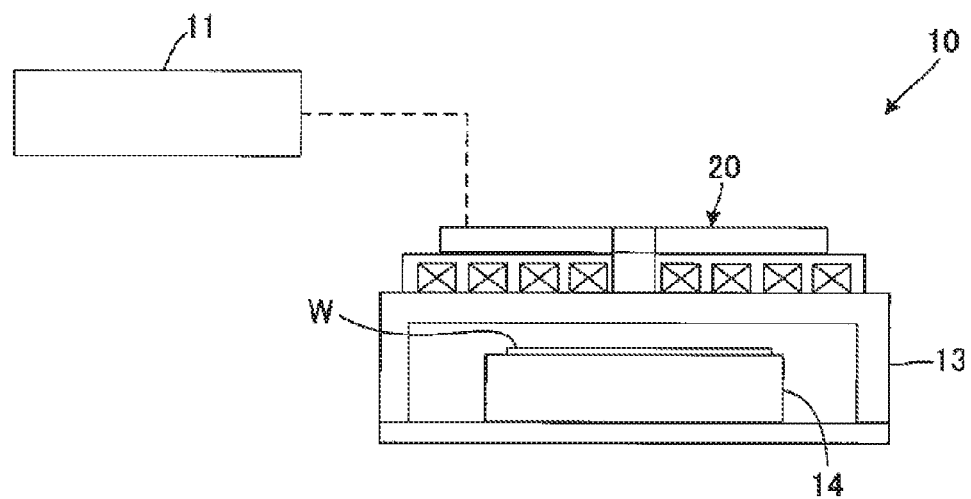
FIG. 1 is a schematic side cross-sectional view of a plasma processing device with which the electromagnet device according to an embodiment of the present invention is used.

Now, embodiments of the present invention will be described with reference to the accompanying drawings. FIG. 1 is a schematic side cross-sectional view of a plasma processing device with which the electromagnet device of an embodiment of the present invention is used. As shown in FIG. 1, a plasma processing device 10 comprises a chamber 13, a substrate stage 14 for a substrate W, an electromagnet device 20 on top of the chamber 13, and a controller 11 for controlling the electromagnet device 20.

The substrate stage 14 is placed in the chamber 13 and is provided thereon with the substrate W. The chamber 13 is evacuated by an unillustrated vacuum pump. The chamber 13 is provided therein with an unillustrated gas supply means that introduces etching gas or the like to the chamber 13.

The electromagnet device 20 is configured to create magnetic fields in the chamber 13 via a partition wall (a top plate of the chamber 13). The magnetic fields created by the electromagnet device 20 are uniform, substantially concentric magnetic fields in a circumferential direction of the electromagnet device 20.

The controller 11 is electrically connected to the electromagnet device 20. The controller 11 is configured to apply a desired coil electric current to the electromagnet device 20.

The plasma processing device 10 uses the electromagnet device 20 to create, for example, horizontal magnetic fields in a direction perpendicular to vertical electric fields formed between the substrate stage 14 and the top plate of the chamber 13. In this way, plasma density distribution is controlled to process substrates.

Figure 2:
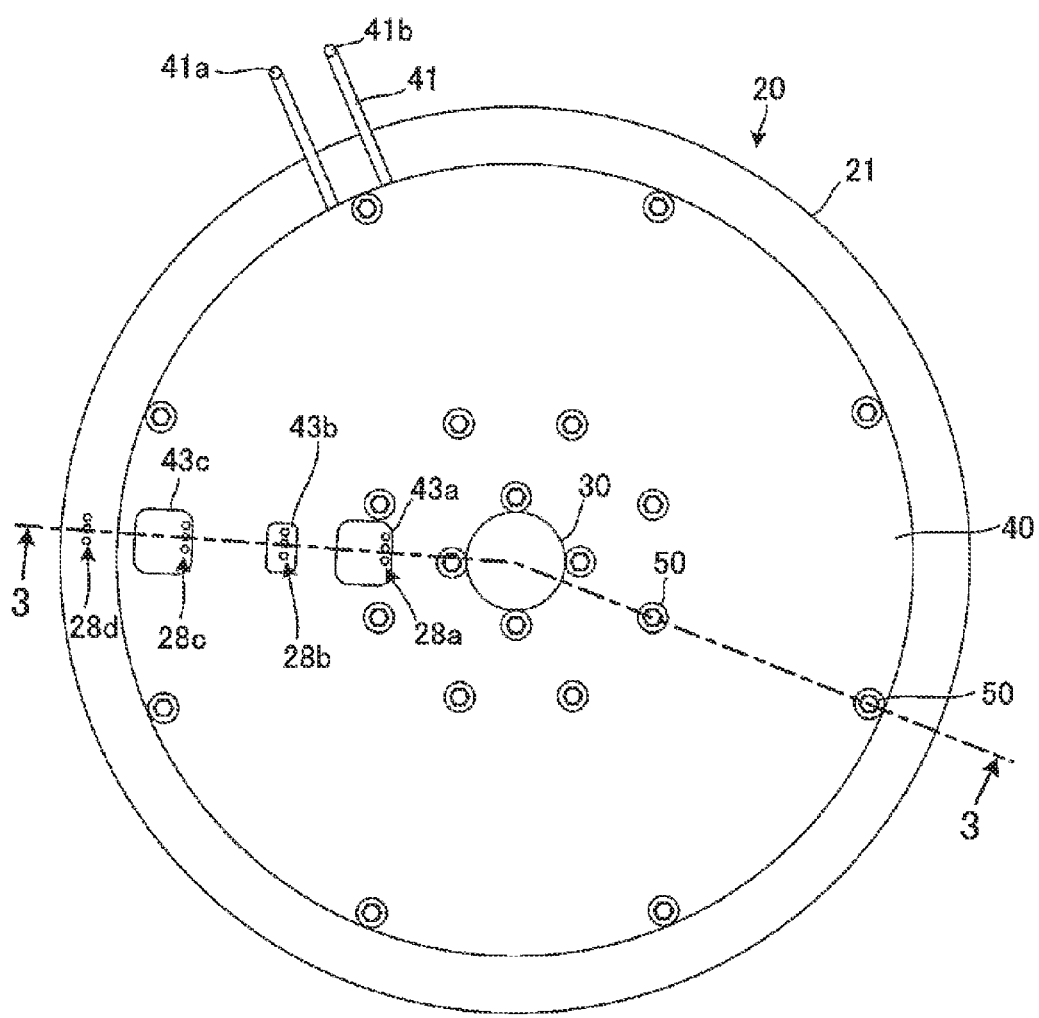
FIG. 2 is a top view of the electromagnet device according to the embodiment of the present invention.
Figure 3:
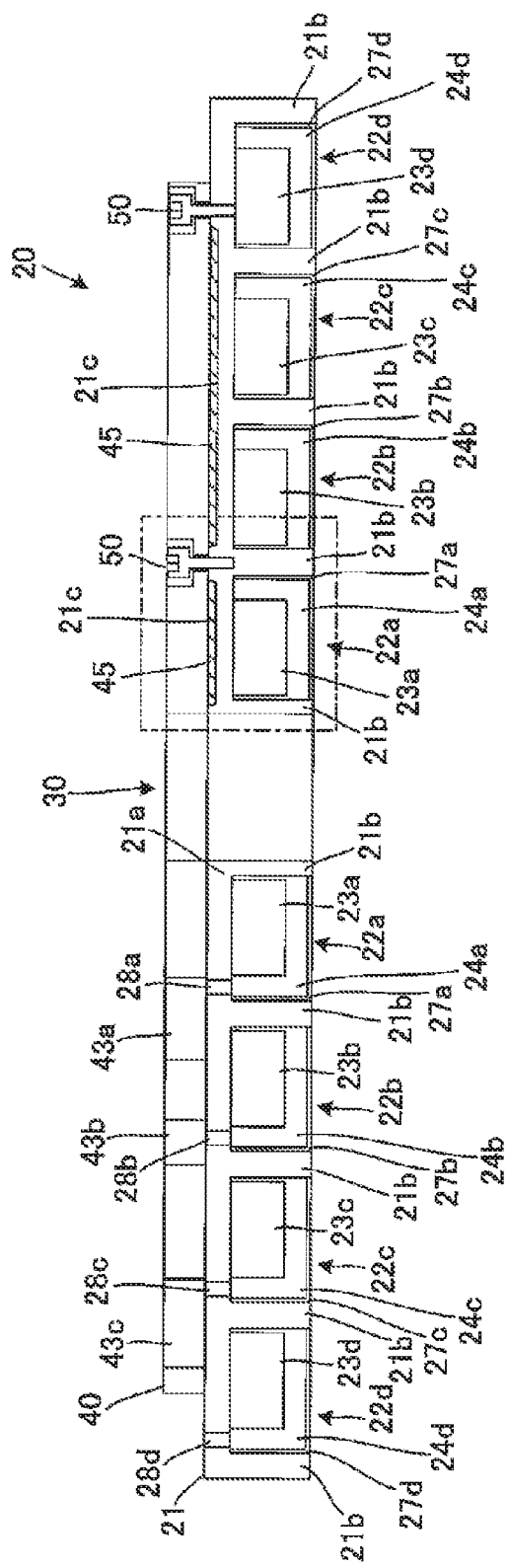
FIG. 3 is a side cross-sectional view of the electromagnet device according to the embodiment of the present invention.
Figure 4:
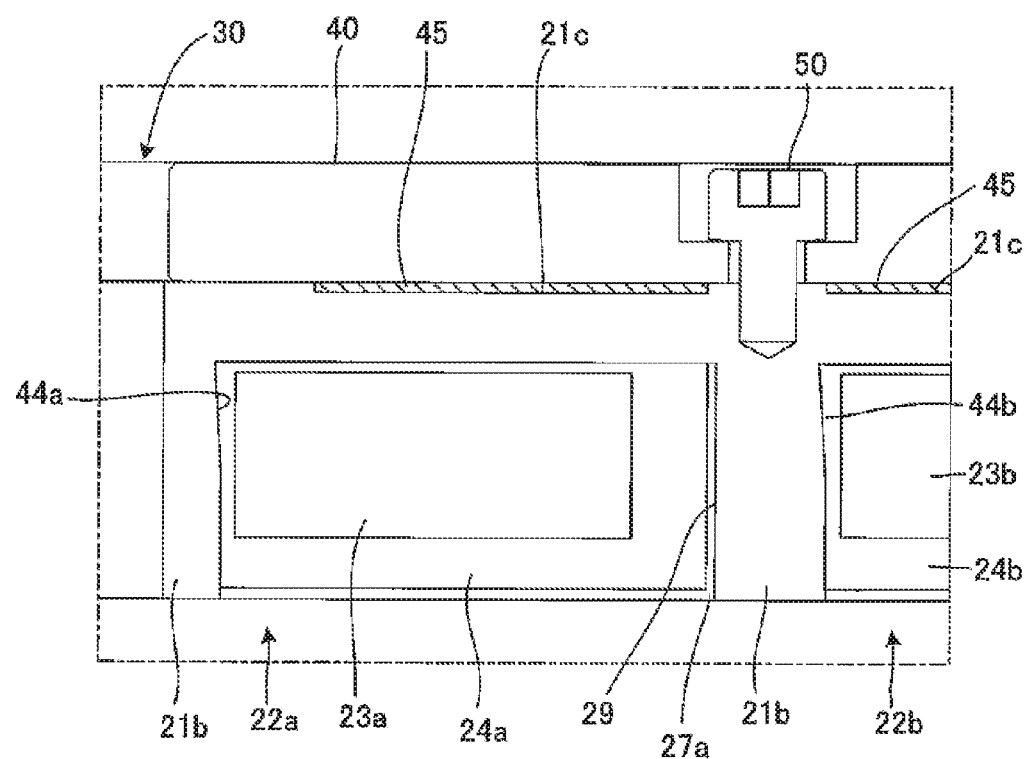
FIG. 4 is an enlarged partial cross-sectional view of the electromagnet device according to the embodiment of the present invention.
Figure 5:
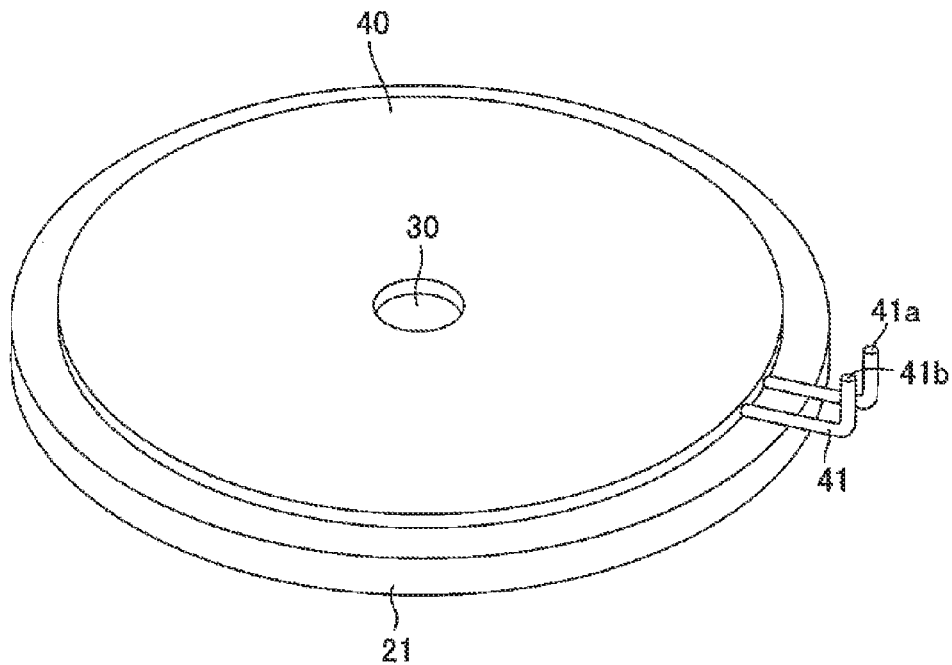
FIG. 5 is a perspective view of the electromagnet device according to the embodiment of the present invention.

Now, the electromagnet device 20 according to the embodiment of the present invention of FIG. 1 will be described in detail. FIG. 2 is a top view of the electromagnet device 20. FIG. 3 is a side cross-sectional view of the electromagnet device 20 taking along 3-3 of FIG. 2. FIG. 4 is an enlarged cross-sectional view of the portion of the electromagnet device 20 enclosed in the broken line of FIG. 3. FIG. 5 is a perspective view of the electromagnet device 20. In the following, the "front surface" of the electromagnet device 20 refers to the surface of the plasma processing device 10 facing the substrate W (an object to be processed), and the "rear surface" of the electromagnet device 20 refers to the surface opposite to the front surface.

As shown in FIGS. 2 and 3, the electromagnet device 20 comprises a substantially disc-shaped yoke 21, annular coils 23a, 23b, 23c, 23d, a cooling plate 40 disposed on the rear surface side of the yoke 21, and a heat transfer sheet 45 between the rear surface of the yoke 21 and the cooling plate 40.

The yoke 21 is made, for example, of pure iron plated with Ni thereon. The pure iron is preferably easy to work. The yoke 21 has a through-hole 30 extending in its direction of thickness at the center through which, for example, a pipeline for plasma processing gas or the like is passed. The yoke 21 comprises a substantially disc-shaped back yoke 21a and five yoke side surface portions 21b disposed on the front surface of the back yoke 21a. The five yoke side surface portions 21b have annular shapes of different diameters. In other words, the yoke 21 has four annular grooves 22a, 22b, 22c, 22d concentrically on the front surface thereof. The grooves 22a, 22b, 22c, 22d increase in diameter in this order.

Coils 23a, 23b, 23c, 23d are of different diameter. That is, the coils 23a, 23b, 23c, 23d increase in diameter in this order. The coils 23a, 23b, 23c, 23d are disposed in an interior of the grooves 22a, 22b, 22c, 22d, respectively. Here, the phrase "disposed in an interior of" means that the coils 23a, 23b, 23c, 23d are completely disposed or accommodated in the grooves 22a, 22b, 22c, 22d without extending beyond them. Since magnetic field lines emanating from the coils 23a, 23b, 23c, 23d when energized pass the back yoke 21a and yoke side surface portions 21b of the yoke 21, accommodating the coils 23a, 23b, 23c, 23d in an interior the grooves 22a, 22b, 22c, 22d facilitates passage of the magnetic field lines through the yoke 21. As a result, accommodating the coils 23a, 23b, 23c, 23d in an interior the grooves 22a, 22b, 22c, 22d makes variations of magnetic field distribution smaller than those if the coils 23a, 23b, 23c, and 23d extended beyond the grooves 22a, 22b, 22c, 22d.

The grooves 22a, 22b, 22c, 22d are provided with epoxy resins 24a, 24b, 24c, 24d. The epoxy resins 24a, 24b, 24c, 24d are provided to enclose the coils 23a, 23b, 23c, 23d therein, so as to secure coils 23a, 23b, 23c, 23d to the yoke 21 and transfer heat. The present invention is not limited to the epoxy resins 24a, 24b, 24c, and 24d and may instead be provided with, for example, a thermosetting resin, such as a silicone-based resin or a urethane resin. It is preferably to use an epoxy resin of good heat resistance, thermal expansion rate, and thermal conductivity.

As described above, the thermosetting resin thermally contracts when the temperature drops from high to normal temperature at the time of thermosetting reaction and curing. This contraction of thermosetting resin may deform the yoke 21. One mode of this deformation occurs when the thermosetting resin provided on the radially outer side of the coils 23a, 23b, 23c, 23d pulls the outer circumferential surface of the grooves 22a, 22b, 22c, 22d in the yoke 21 radially inwards. For this reason, as shown is FIGS. 3 and 4, the electromagnet device 20 of this embodiment is provided with clearances 27a, 27b, 27c, 27d between the epoxy resins 24a, 24b, 24c, 24d provided on the radially outside of the coils 23a, 23b, 23c, 23d and the outer circumferential surface of the grooves 22a, 22b, 22c, 22d in the yoke 21. The radially inside of the coils 23a, 23b, 23c, 23d, on the other hand, is secured via the epoxy resins 24a, 24b, 24c, 24d to the yoke 21.

As shown in FIG. 4, the outer circumferential surface of the groove 22a is coated, for example, with fluorine-based release agent 29. This release agent 29 is applied to the outer circumferential surface of the groove 22 before the groove 22a is filled with the epoxy resin 24a. This facilitates removal of the epoxy resin 24a from the outer circumferential surface of the groove 22a when the epoxy resin 24a thermally sets and contracts. As a result, any stress on the yoke 21 is reduced, and the clearance 27a is formed. The release agent 29, though omitted from the figure, is also applied to the outer circumferential surface of the grooves 22b, 22c, 22d in the same manner.

Removal of the epoxy resins 24a, 24b, 24c, 24d from the outer circumferential surface of the grooves 22a, 22b, 22c, 22d reduces radially inward stress on the yoke 21 that occurs when the epoxy resins 24a, 24b, 24c, 24d contract, preventing deformation of the yoke 21.

The coils 23a, 23b, 23c, 23d are so disposed that a central portion of the width of the coils 23a, 23b, 23c, 23d is positioned radially inward of the center of the width of the grooves 22a, 22b, 22c, 22d, and that a central portion of the depth of the coils 23a, 23b, 23c, 23d is closer than the center of the depth of the grooves 22a, 22b, 22c, 22d to the bottom side.

As shown in FIG. 4, the inner circumferential surface of the grooves 22a, 22b has tapered surfaces 44a, 44b that increase in width with increasing depth of the grooves 22a, 22b. That is, by the tapered surfaces 44a, 44b, the width of the bottom of the grooves 22a, 22b is larger, and the width of the entrance side (opposite to the bottom side) of the grooves 22a, 22b is narrower. As shown, part of the inner circumferential surface of the grooves 22a, 22b may be tapered or the whole inner circumferential surface may be tapered. The taper angle is preferably from about 2 degrees to about 3 degrees inclusive. This prevents removal of the coils 23a, 23b and epoxy resins 24a, 24b from the grooves 22a, 22b. Though not illustrated, the grooves 22c, 22d also have an inner circumferential tapered surface that increases in width with increasing depth.

As shown in FIG. 3, the back yoke 21a of the yoke 21 has a through-holes 28a, 28b, 28c, 28d that pass through the interior of the grooves 22a, 22b, 22c, 22d and the rear side of the yoke 21. As shown in FIG. 2, the through-holes 28a, 28b, 28c, 28d each comprise three hollow sections. A total of four wires, two wires (see FIG. 6) for energizing coils 23a, 23b, 23c, 23d and unillustrated two temperature sensor wires for detecting the temperature of the coils 23a, 23b, 23c, 23d, are passed from the coils 23a, 23b, 23c, 23d though the three hollow sections of the through-holes 28a, 28b, 28c, 28d onto the rear side of the yoke 21.

As shown in FIGS. 2 and 3, the cooling plate 40 is disposed on the rear side of the yoke 21 and is fasten by a fastening member 50, such as a bolt, to the yoke 21. The cooling plate 40 has holes 43a, 42b, 43c that pass through its depth. The holes 43a, 43b, 43c are so formed to coincide in positon with the through-holes 28a, 28b, 28c when the cooling plate 40 is fastened to the rear surface of the yoke 21. As such, the wires for energizing the coils 23a, 23b, 23c (see FIG. 6) and the unillustrated temperature sensor wires for detecting the temperature of the coils 23a, 23b, 23c are passed from the coil 23a, 23b, 23c through the through-holes 28a, 28b, 28c and the holes 43a, 43b, 43c onto the rear side of the cooling plate 40. The cooling plate 40 is not disposed on the rear side at the position of the through-hole 28d of the yoke 21. As such, the wire for energizing the coil 23d (see FIG. 6) and the unillustrated temperature sensor wire for detecting the temperature of the coil 23d are passed only through the through-hole 23d onto the rear surface of the yoke 21.

As shown in FIGS. 2 and 5, the cooling plate 40 has a water cooling pipe 41 for passage of water therein, the water cooling pipe 41 having an inlet 41a and an outlet 41b located outside the cooling plate 40.

As shown in FIG. 3, the yoke 21 has a recess 21c on the rear surface thereof, the recess 21c being provided with a heat transfer sheet 45 for transfer of heat from the yoke 21 to the cooling plate 40. In other words, the heat transfer sheet 45 is disposed between the rear surface of the yoke 21 and the cooling plate 40 so that one side of the heat transfer sheet 45 is in contact with the yoke 21 and another side is in contact with the cooling plate 40. The heat transfer sheet 45 extends almost entirely between the rear surface of the yoke 21 and the cooling plate 40. The cooling plate 40 is fastened tightly to the heat transfer sheet 45 by the fastening member 50. The depth of the recess 21c exerts appropriate compressive pressure on the heat transfer sheet 45, thereby keeping its heat transfer characteristic.

Heat generated when the coils 23a, 23b, 23c, 23d are energized transfers through the epoxy resins 24a, 24b, 24c, 24d to the yoke 21. The heat that has reached the yoke 21 is conducted by the heat transfer sheet 45 from the back yoke 21a to the cooling plate 40 efficiently. This results in efficient removal of heat that occurs when the coil 23a, 23b, 23c, 23d are energized.

In the case that the controller 11 as shown in FIG. 1 is disposed on the rear side of the cooling plate 40, the cooling plate 40 can remove heat from an amplifier and so on of the controller 11.

Figure 6:
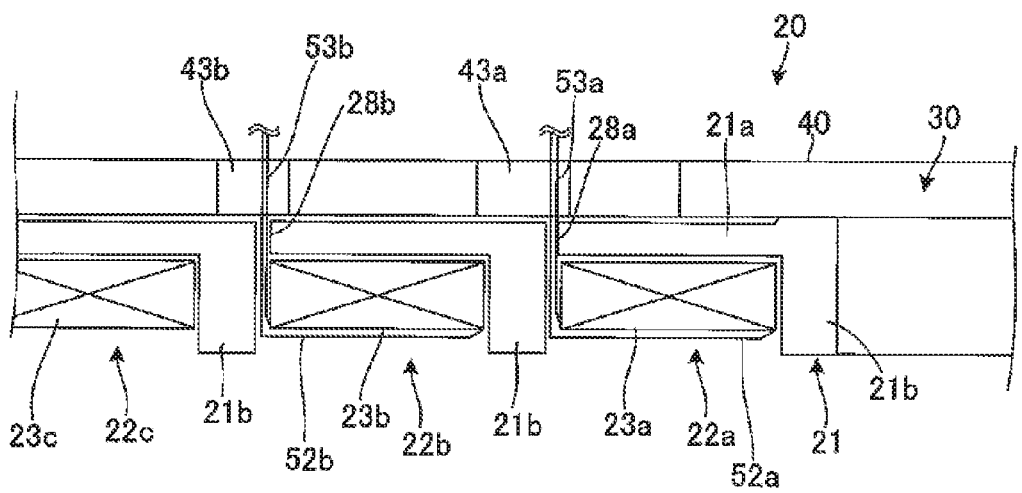
FIG. 6 is an enlarged partial cross-sectional view of the electromagnet device according to the embodiment of the present invention.

Now, wiring of the coils 23a, 23b, 23c, 23d of FIG. 2 will be described. FIG. 6 is an enlarged partial cross-sectional view of the electromagnet device 20. The coil 23a has wires 52a, 53a, the coil 23b has wires 52b, 53b. Though omitted from the figure, the coils 23c, 23d also have wires. The coil 23a, 23b, 23c, 23d are each electrically connected to the controller 11 by separate wiring so that the controller 11 can control the coil 23a, 23b, and 23c, 23d independently. As a result, when the controller 11 applies desired electric currents to the coils 23a, 23b, 23c, 23d, desired concentric magnetic fields can be formed on the front side of the electromagnet device 20. This in turn makes it possible for the plasma processing device 10 of FIG. 1 to adjust the distribution of plasma formed in the chamber 13.

Figure 7:
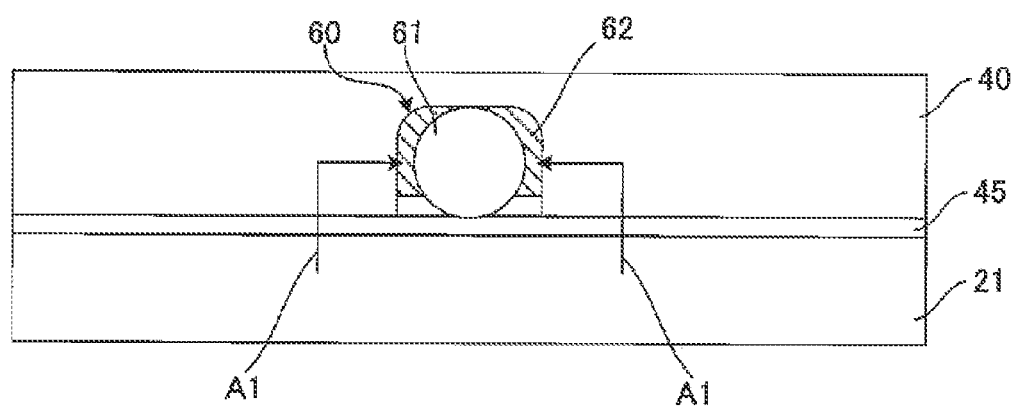
FIG. 7 is an example of a cross section of a cooling plate.
Figure 8:
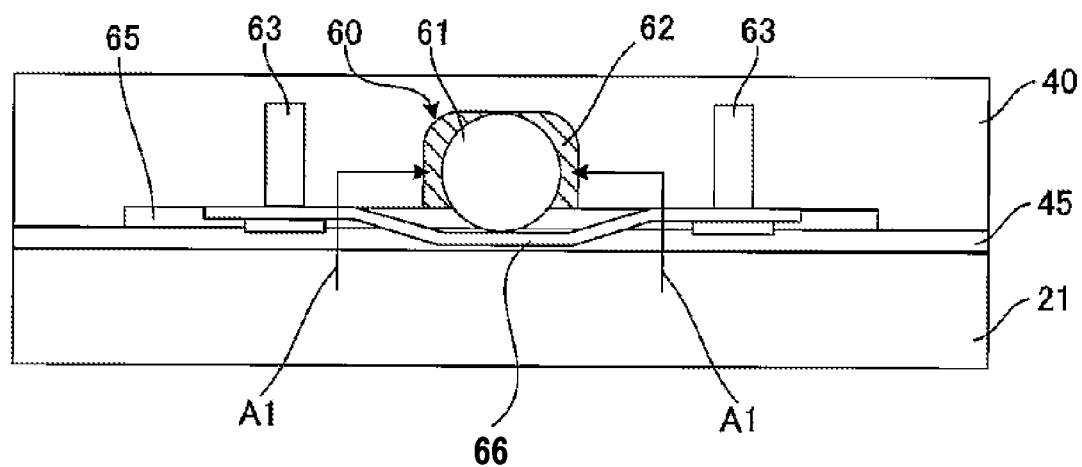
FIG. 8 is another example of a cross section of a cooling plate.

Now, the cooling structure of the cooling plate 40 of FIGS. 2 to 6 will be described. FIGS. 7 and 8 show an example of a cross section of the cooling plate 40. For convenience of description, the yoke 21 and the heat transfer sheet 45 of FIG. 3 are schematically drawn in FIGS. 7 and 8.

As shown in FIG. 7, the cooling plate 40 disposed via the heat transfer sheet 45 on the rear side of the yoke 21 has a groove 60 on the (front) side in contact with the heat transfer sheet 45. The groove 60 is provided with a water cooling pipe 61 through which a cooling medium such as water flows. The water cooling pipe 61 and the groove 60 have a clearance therebetween that is filled with a seal agent 62. The seal agent 62 fixes the water cooling pipe 61 to the interior of the groove 60. This enables the cooling medium flowing through the water cooling pipe 61 to absorb heat efficiently through the yoke 21, heat transfer sheet 45, and seal agent 62 when the coils 23a, 23b, 23c, 23d (see FIG. 3, etc.) are energized. In the figure, arrow A1 indicates the transfer of heat. The cooling plate 40 is made, for example, of aluminum and the water cooling pipe 61 is made of a stainless steel (SUS) or the like.

The cooling plate 40 of FIG. 8 has a recess 65 on the (front) side in contact with the heat transfer sheet 45, the recess 65 has a groove 60 therein. The groove 60 has a water cooling pipe 61. Between the water cooling pipe 61 and the groove 60 is filled the seal agent 62. The recess 65 is provided with a holding plate 66 that holds the water cooling pipe 61 against the groove 60. The holding plate 66 is fixed to the cooling plate 40 by a holding screw 63. In this way, the water cooling pipe 61 is fixed on the groove 60 by the seal agent 62 and the holding plate 66. As with the cooling plate 40 of FIG. 7, heat generated by energization of the coils 23a, 23b, 23c, 23d (see FIG. 3, etc.) is efficiently absorbed via the yoke 21, heat transfer sheet 45, and seal agent 62 by the cooling medium flowing through the water cooling pipe 61. With the cooling plate 40 of FIG. 8, the holding plate 66 can reliably fix the water cooling pipe 61 in the groove 60.

As described above, the electromagnet device 20 of this embodiment has the clearances 27a, 27b, 27c, 27d between the epoxy resins 24a, 24b, 24c, 24d on the radially outside of the coils 23a, 23b, 23c, 23d and the outer circumferential surface of the grooves 22a, 22b, 22c, 22d. This prevents deformation of the yoke 21 as the epoxy resins 24a, 24b, 24c, 24d contract. Further, the yoke 21 is heated by heat generated by the coils 23a, 23b, 23c, 23d when they are supplied with electric current during plasma processing. At this time, stress occurring due to the difference in thermal expansion coefficient between the coils 23a, 23b, 23c, 23d and the yoke 21 is made smaller than that if the epoxy resins 24a, 24b, 24c, 24d were bonded to the outer circumferential surface of the grooves 22a, 22b, 22c, 22d.

Since the release agent 29 is applied to the outer circumferential surface of the grooves 22a, 22b, 22c, 22d, the epoxy resins 24a, 24b, 24c, 24d can be easily removed from the outer circumferential surface of the grooves 22a, 22b, 22c, 22d when the epoxy resins 24a, 24b, 24c, 24d thermally set. This reduces the stress on the yoke 21 and also facilitates the formation of clearances 27a, 27b, 27c, 27d.

The electromagnet device 20 of the present embodiment uses the release agent 29. Alternatively, a spacer, for example, may be used between the epoxy resins 24a, 24b, 24c, 24d on the radially outer side of the coils 23a, 23b, 23c, 23d and the outer circumferential surface of the grooves 22a, 22b, 22c, 22d, and clearances 27a, 27b, 27c, 27d may be made in the grooves 22a, 22b, 22c, 22d to prevent the epoxy resins 24a, 24b, 24c, 24d from coming into contact with the grooves 22a, 22b, 22c, 22d.

The electromagnet device 20 of the present embodiment has the coils 23a, 23b, 23c, 23d accommodated in an interior the grooves 22a, 22b, 22c, 22d. This makes variations in magnetic field distribution smaller than those if coils 23a, 23b, 23c, 23d extended beyond the grooves 22a, 22b, 22c, 22d.

The electromagnet device 20 of the present embodiment has the coils 23a, 23b, 23c, 23d disposed so that a central portion of the width of the coils 23a, 23b, 23c, 23d is positioned radially inward of the center of the width of the grooves 22a, 22b, 22c, 22d. This brings the coils 23a, 23b, 23c, 23d closer to the yoke 21, resulting in improved efficiency in transfer of heat generated by energization of the coils 23a, 23b, 23c, 23d, from the radially inside of the coils 23a, 23b, 23c, 23d, having no space from the yoke 21, via the epoxy resins 24a, 24b, 24c, 24d.

The electromagnet device 20 of this embodiment has the coils 23a, 23b, 23c, 23d disposed so that a central portion of the depth of the coils 23a, 23b, 23c, 23d is positioned closer than the center of the depth of the grooves 22a, 22b, 22c, 22d to the bottom side. This brings the coils 23a, 23b, 23c, 23d closer to the yoke 21, such that heat generated by energization of the coils 23a, 23b, 23c, 23d is transferred efficiently via the epoxy resins 24a, 24b, 24c, 24d to the yoke 21.

The electromagnet device 20 of this embodiment uses, for example, the epoxy resins 24a, 24b, 24c, 24d, which are heat-resistant thermosetting resin, so as to prevent a reduction in the strength of epoxy resins 24a, 24b, 24c, 24d which would otherwise be caused by the heat generated by energization of the coils 23a, 23b, 23c, 23d. The relatively low thermal expansion coefficient of the epoxy resins 24a, 24b, 24c, 24d makes it possible to keep relatively small the expansion of the epoxy resins 24a, 24b, 24c, 24d due to the heat generated by energization of the coils 23a, 23b, 23c, 23d and thus reduce displacement of the coils 23a, 23b, 23c, 23d due to the expansion of the epoxy resins 24a, 24b, 24c, 24d. The use of, for example, the epoxy resins 24a, 24b, 24c, 24d, a thermosetting resin of good (high) thermal conductivity, enables efficient transfer to the yoke 21 of the heat generated by energization of the coils 23a, 23b, 23c, 23d. This embodiment is not limited to the epoxy resin and may be provided with other resin of good heat resistance and thermal conductivity. The thermosetting resin of good heat resistance and thermal conductivity used in this embodiment preferably has a thermal conductivity of about 0.5 w/m*k or greater and a heat resistance whose glass-transition temperature is about 150 degrees C. or greater.

The electromagnet device 20 of this embodiment has at least part of the inner circumferential surface of the grooves 22a, 22b, 22c, 22d that forms a tapered surface that increases in width with increasing depth of the grooves 22a, 22b, 22c, 22d, so that in the unlikely event that the radially inside and rear side of the epoxy resins 24a, 24b, 24c, 24d should peel off the grooves 22a, 22b, 22c, 22d, the epoxy resins 24a, 24b, 24c, 24d will be caught by the tapered surface of the grooves 22a, 22b, 22c, 22d. This prevents removal of the coils 23a, 23b, 23c, 23d from the grooves 22a, 22b, 22c, 22d.

The electromagnet device 20 of this embodiment has the wiring for energization of the coils 23a, 23b, 23c, 23d disposed via the through-holes 28a, 28b, 28c, 28d on the rear side of the yoke 21 and the cooling plate 40. This minimizes the effect of magnetic field that may be caused by the wiring, resulting in uniform magnetic field in the circumferential direction on the front side of the electromagnet device 20.

The electromagnet device 20 of this embodiment has the cooling plate 40 disposed on the rear side of the yoke 21 to remove from the yoke 21 the heat generated by energization of the coils 23a, 23b, 23c, 23d. The electromagnet device 20 of this embodiment has the heat transfer sheet 45 disposed between the rear surface of the yoke 21 and the cooling plate 40, with the result of more efficient removal of heat from the yoke 21.

The electromagnet device 20 of this embodiment described above has the grooves 22a, 22b, 22c, 22d, the coils 23a, 23b, 23c, 23d, etc., four each. However, it is sufficient to have at least one of the grooves 22a, 22b, 22c, 22d, at least one of the coils 23a, 23b, 23c, 23d, etc.

In the above embodiment, the plasma etching device is only one example of the plasma processing device 10. Alternatively, the electromagnet device 20 may be applied to a device using magnetic force for generation of plasma, such as a sputtering device or a plasma chemical vapor deposition (CVD) device.

Second Embodiment

Figure 9:
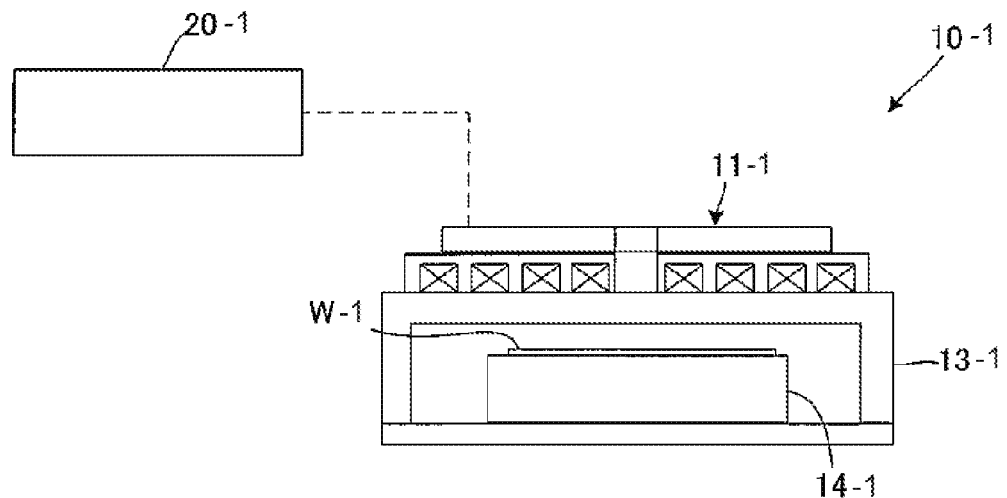
FIG. 9 is a schematic side cross-sectional view of a plasma processing device with which the electromagnet controller according to a second embodiment of the present invention is used.

Now, the second embodiment of the present invention will be described with reference to the accompanying drawings. FIG. 9 is a schematic side cross-sectional view of a plasma processing device with which the electromagnet controller of the second embodiment of the present invention, a controller, is used. As shown in FIG. 9, a plasma processing device 10-1 comprises: a chamber 13-1, a substrate stage 14-1 for a substrate W-1; an electromagnet device 11-1 on top of the chamber 13-1; and a controller 20-1 (electromagnet controller) for controlling the electromagnet device 11-1.

The substrate stage 14-1 is placed in the chamber 13-1 and is provided thereon with the substrate W-1. The chamber 13-1 is evacuated by an unillustrated vacuum pump. The chamber 13-1 is provided therein with an unillustrated gas supply means that introduces etching gas or the like to the chamber 13-1.

The electromagnet device 11-1 is configured to create magnetic fields in the chamber 13-1 via a partition wall (a top plate of the chamber 13-1). The magnetic fields created by the electromagnet device 11-1 are horizontal magnetic fields parallel to the substrate W-1.

The controller 20-1 is electrically connected to the electromagnet device 11-1. The controller 20-1 is configured to apply required coil electric current to the electromagnet device 11-1. The controller 20-1 is configured to receive temperature information (temperature signal) from an unillustrated temperature sensor of the electromagnet device 11-1. The controller 20-1 can be placed at a desired location. For example, a device frame may be provided for the placement of the controller thereon.

The plasma processing device 10-1 generates, for example, electric fields perpendicular to a plane of the substrate W-1 by creating a potential difference between the substrate stage 14-1 and the top plate of the chamber 13-1. Horizontal magnetic fields at right angles to the vertical electric fields are set up by the electromagnet device 11-1. As a result, dense plasma is generated for substrate processing.

Now, the controller 20-1 according to the embodiment of the present invention of FIG. 9 will be described in detail.

Figure 10:
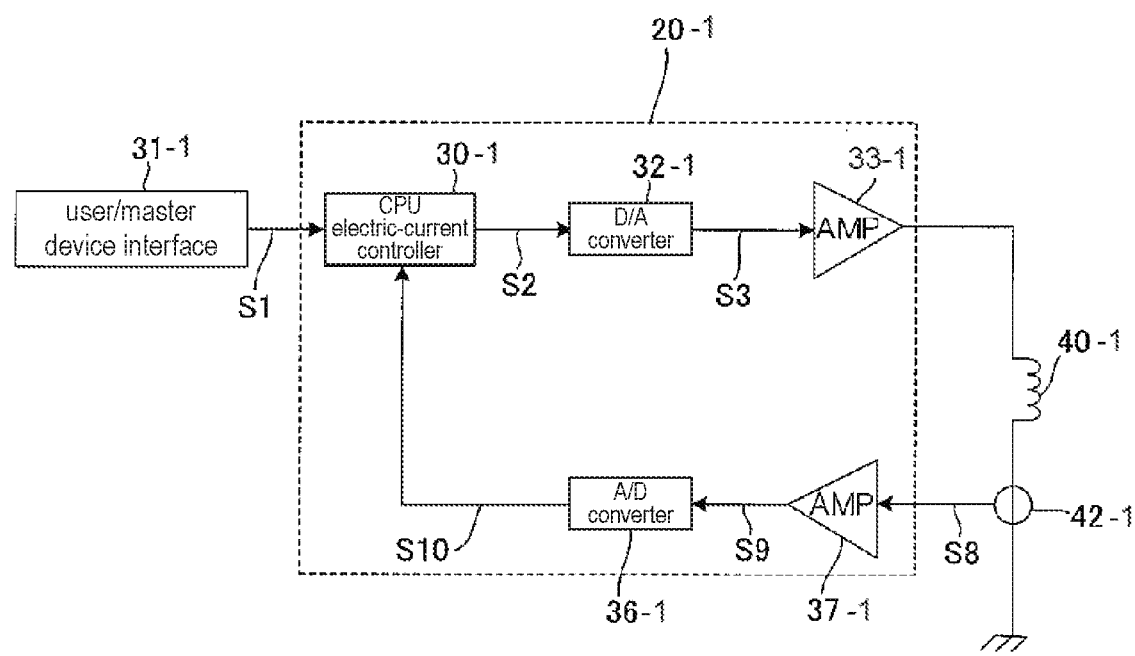
FIG. 10 is a block diagram of a controller and an excitation coil of an electromagnet device according to the second embodiment.

FIG. 10 is a block diagram of the controller 20-1 and an excitation coil of the electromagnet device 11-1 of FIG. 9. As shown, the controller 20-1 of the second embodiment of the present invention is configured to receive an electric current command value S1, which is a target electric current value predetermined by a user/master device interface 31-1, such as a personal computer (PC). The controller 20-1 is connected to the excitation coil 40-1 of the electromagnet device 11-1 of FIG. 9 and is configured to apply certain voltage to the excitation coil 40-1.

Wiring of the excitation coil 40-1 is provided with an electric-current detector 42-1 for detecting electric current flowing through the excitation coil 40-1. The electric-current detector 42-1 is configured to transmit to the controller 20-1 the value of detected electric current flowing through the excitation coil 40-1.

The controller 20-1 comprises: a central processing unit (CPU) electric-current controller 30-1 for receiving an electric-current command signal S1 from the user/master device interface 31-1; a D/A converter 32-1 for receiving an output voltage command value S2 from the CPU electric-current controller 30-1; and an amplifier 33-1 (driver) for receiving an output voltage command value S3 from the D/A converter 32-1. The second embodiment and the third embodiment below use the CPU electric-current controller 30-1. However, the CPU electric-current controller 30-1 may be replaced with a DSP electric-current controller comprising a digital signal processor (DSP).

The controller 20-1 comprises: an amplifier 37-1 (electric-current value receiver) for receiving an electric current signal S8 indicating an electric current value S8 of the excitation coil 40-1, from the electric-current detector 42-1; and a A/D converter 36-1 for receiving an electric current signal S9 from the amplifier 37-1.

To control the electric current flowing through the excitation coil 40-1, an electric current command signal S1 from the user/master device interface 31-1 is first transmitted in digital quantity to the CPU electric-current controller 30-1. The CPU electric-current controller 30-1 calculates an output voltage, based on the electric current command signal received, and transmits the digital quantity of output voltage command value S2 to the D/A converter 32-1. The D/A converter 32-1 converts the digital quantity of output voltage command value S2 to an analog quantity of output voltage command value S3 and transmits the analog quantity of output voltage command value S3 to the amplifier 33-1. The amplifier 33-1 amplifies the output voltage command value S3 and feeds an analog quantity of output voltage to the excitation coil 40-1, so that electric current flows through the excitation coil 40-1.

The electric-current detector 42-1 detects the electric current flowing through the excitation coil 40-1 and transmits an electric current signal S8 to the amplifier 37-1. The amplifier 37-1 amplifies the electric current signal S8 and transmits an analog quantity of electric current signal S9 to the A/D converter 36-1. The A/D converter 36-1 transmits an electric current signal S10, which is a digital quantity converted from the analog quantity of electric current signal S9, to the CPU electric-current controller 30-1.

The CPU electric-current controller 30-1 again calculates an output voltage command signal S2, based on the electric current signal S10 received, and controls the electric current applied to the excitation coil 40-1 via the A/D converter 32-1 and the amplifier 33-1.

The CPU electric-current controller 30-1 is configured to compare the electric current signal S10 received from the A/D converter 36-1 and the electric current command signal S1 from the user/master device interface 31-1. The CPU electric-current controller 30-1 calculates the difference between the electric current value of the electric current signal S10 and the electric current value of the electric current command signal S1 and compares the difference with a predetermined value stored in memory of the CPU electric-current controller 30-1. The CPU electric-current controller 30-1 is configured to determine that a defect has occurred in the excitation coil 40-1 when the difference is determined to be greater than or equal to the predetermined value, and give warning to unillustrated external display means or the like. In other words, whether the difference is large is determined by setting the predetermined value to that large value. A large difference means that the electric current value actually applied to the excitation coil 40-1 is far apart from the command value. One conceivable situation indicated by such a case is, for example, occurrence of layer short in the excitation coil 40-1.

Figure 11:
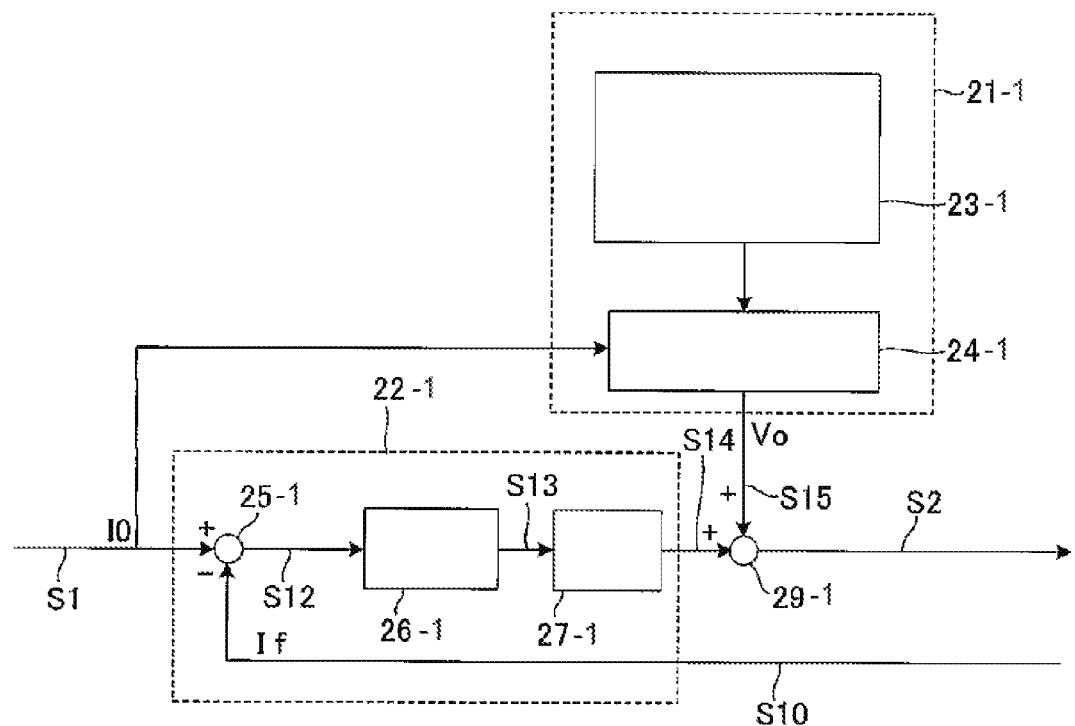
FIG. 11 is a control block diagram of a CPU electric-current controller according to the second embodiment.

FIG. 11 is a control block diagram of the CPU electric-current controller 30-1 of FIG. 10.

The CPU electric-current controller 30-1 comprises: an output voltage command calculator 21-1 for calculating an output voltage command value, based on the electric current command signal S1 of FIG. 10; an electric current difference calculator 22-1 for calculating an electric current difference signal S12 between the electric current signal S10 and the electric current command signal S1 of FIG. 10 and PI-controlling the electric current difference signal S12; and an adder 29-1 for adding an output signal S14 output from the electric current difference calculator 22-1 and an output voltage command signal S15 output from the output voltage command calculator 21-1.

The output voltage command calculator 21-1 comprises memory 23-1 storing a resistance value (series resistance value) for the excitation coil 40-1 (see FIG. 10) in certain use conditions; and a calculator 24-1 for calculating an output voltage command value, based on the resistance value and the electric current command signal S1.

The electric current difference calculator 22-1 comprises: a subtracter 25-1 for calculating an electric current difference from the electric current command signal S1 and the electric current signal S10 and outputting an electric current difference signal S12; an integration operator 26-1 having a low-pass filter or the like that integrates the electric current difference signal S12; and a proportional operator 27-1 for performing proportional action on an electric current difference signal S13 after integrating operation.

The CPU electric-current controller 30-1 transmits the electric current command value S1 received from the user/master device interface 31-1 of FIG. 10 to the output voltage command calculator 21-1. The output voltage command calculator 21-1 reads a resistance value ($R_t$) (digital value) of the excitation coil 40-1 (see FIG. 10) in certain use conditions from the memory 23-1 and transmits the value to the calculator 24-1. The calculator 24-1 calculates an output voltage command value ($V_o$) from the resistance value ($R_t$) and an electric current command value ($I_0$) of the electric current command signal S1. In other words, the formula $Vo=I_0*R_t$ is used to calculate the output voltage command value ($V_o$), in accordance to the Ohm's law. The output voltage command value ($V_o$) calculated is transmitted as an output voltage command signal S15 to the adder 29-1. This enables calculation and output of the output voltage command value ($V_o$) directly corresponding to the electric current command value ($I_0$), with the resistance value of the excitation coil 40-1 (see FIG. 10) taken into account. This in turn makes shorter the amount of time (response time) required for the electric current flowing through the excitation coil 40-1 to reach a target electric current value (electric current command value) than that if the output voltage command value were calculated, solely based on the difference.

When the electric current difference calculator 22-1 has received the electric current signal S1O, the subtracter 25-1 subtracts the electric current value indicated by the electric current signal S10 from the electric current value indicated by the electric current command value signal S1 to yield an electric current difference. The subtracter 25-1 outputs the resultant electric current difference as an electric current difference signal S12 to the integration operator 26-1. The integration operator 26-1 receives and integrates the electric current difference signal S12. The proportional operator 27-1 receives the integrated electric current difference signal S13 from the integration operator 26-1 and performs proportional action on the electric current difference signal S13. The electric current difference signal S14 after the proportional action has been performed, is transmitted to the adder 29-1. The adder 29-1 adds the electric current difference signal S14 to the output voltage command signal S15 and transmits the output voltage command signal S2 taking the electric current difference into account, to the D/A converter 32-1 (see FIG. 10). This makes it possible to calculate an output voltage value that takes into account the difference between the electric current value flowing through the excitation coil 40-1 and the target electric current value and control the electric current value flowing through the excitation coil 40-1.

As described above, the controller 20-1 of the second embodiment uses the output voltage command calculator 21-1 to calculate an output voltage command value, based on the resistance value ($R_t$) of the excitation coil 40-1 (see FIG. 10) in certain use conditions. This enables the controller 20-1 to promptly bring the electric current flowing through the excitation coil 40-1 toward the electric current command value without increasing a proportional gain or integration constant of the electric current difference calculator 22-1. In other words, the time required for the electric current flowing through the excitation coil 40-1 to reach the target electric current value (electric current command value) can be shortened, compared with calculation of the output voltage command value solely based on the difference. In this way, the controller 20-1 of the second embodiment brings about electric current control with improved stability and precision. Further, the control of the excitation coil 40-1 on the basis of calculation of the output voltage command value, with the resistance value of the excitation coil 40-1 taken into account, makes it possible to reduce the time required to reach the target electric current value with higher control precision than the prior art (capable of reducing the difference between the target electric current value and the actual electric current value). Further, there is no need to use a high-precision A/D or D/A converter, reducing the device cost.

The controller 20-1 of the second embodiment takes into account the difference between the electric current value flowing through the excitation coil 40-1 and the electric current command value (target electric current value), in addition to the resistance value ($R_t$), to calculate the output voltage command value. In this way, even if the resistance value ($R_t$) of the excitation coil 40-1 in certain conditions stored beforehand differs greatly from the actual resistance value ($R_t$) of the excitation coil 40-1, the electric current value flowing through the excitation coil 40-1 can be brought toward the electric current command value with precision on the basis of the difference between the electric current value through the excitation coil 40-1 and the electric current command value.

Third Embodiment

Figure 12:
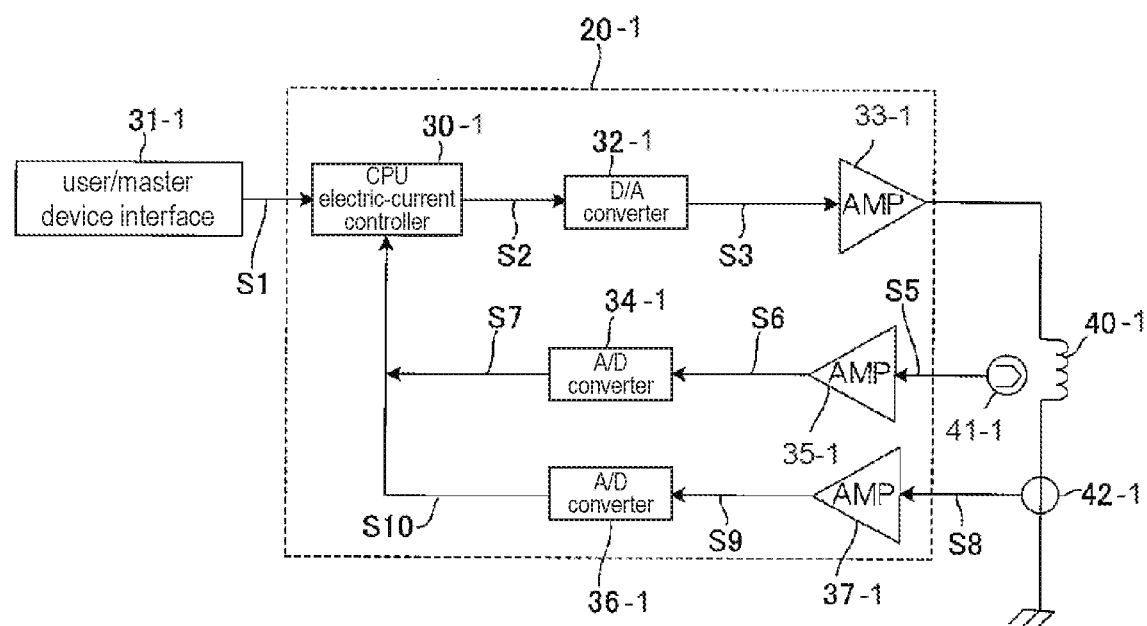
FIG. 12 is a block diagram of a controller and an excitation coil of an electromagnet device according to the third embodiment.

Now, the electromagnet controller of the third embodiment will be described. FIG. 12 is a block diagram of a controller and an excitation coil of an electromagnet device. Description of the plasma processing device for the electromagnet controller of the third embodiment, since it is the same as the plasma processing device of FIG. 9, is omitted.

The third embodiment is different from the second one in that the former has a mechanism for detecting the temperature of an excitation coil. Other features of the third embodiment are the same as those of the second embodiment, and description thereof is omitted by using the same reference numerals as those of the second embodiment.

As shown in FIG. 12, the excitation coil 40-1 is provided with a temperature detector 41-1, such as a temperature sensor. The temperature detector 41-1 is configured to transmit a detected temperature of the excitation coil 40-1 to the controller 20-1.

The controller 20-1 comprises: an amplifier 35-1 (temperature receiver) for receiving a temperature signal S5 indicating the temperature of the excitation coil 40-1 from the temperature detector 41-1; and an A/D converter 34-1 for receiving a temperature signal S6 from the amplifier 35-1.

The temperature detector 41-1 detects the temperature of the excitation coil 40-1 and transmits the temperature signal S5 to the amplifier 35-1. The amplifier 35-1 amplifies the temperature signal S5 and transmits the analog quantity of the temperature signal S6 to the A/D converter 34-1. The A/D converter 34-1 transmits a temperature signal S7, which is a digital quantity converted from the analog quantity of the temperature signal S6, to the CPU electric-current controller 30-1.

Figure 13:
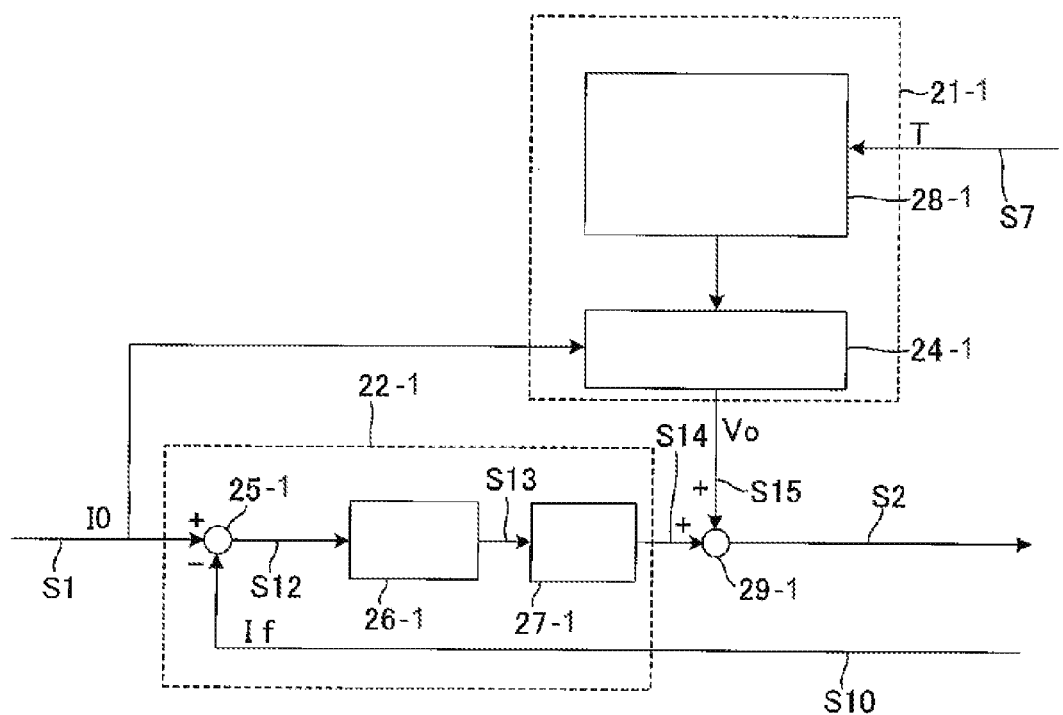
FIG. 13 is a control block diagram of a CPU electric-current controller of the third embodiment.

FIG. 13 is control block diagram of the CPU electric-current controller 30-1 of the third embodiment. The CPU electric-current controller 30-1 of the controller 20-1 of the third embodiment is different from the CPU electric-current controller 30-1 of the controller 20-1 of the second embodiment in that the output voltage command calculator 21-1 of the former for calculating an output voltage command value has a coil resistance calculator 28-1. The details are as follows.

As shown in FIG. 13, the output voltage command calculator 21-1 of the CPU electric-current controller 30-1 has a coil resistance calculator 28-1 for calculating the resistance value of the excitation coil 40-1, instead of the memory 23-1 of the second embodiment. The coil resistance calculator 28-1 receives a temperature signal S7 from the A/D converter 34-1 of FIG. 12. The coil resistance calculator 28-1 calculates the resistance value ($R_t$) of the excitation coil 40-1 on the basis of the temperature (T) of the coil indicated by the temperature signal S7. The resistance value ($R_e$) is calculated in the following way. The resistance value ($R_t$) is calculated from ($R_t$)=$R_{20}*(1+\alpha T)$, where $R_{20}$ is the resistance value of the excitation coil 40-1 at 20 degrees C. and $\alpha$ is a temperature coefficient of the resistance value of the excitation coil 40-1. The resistance value $R_{20}$ of the excitation coil 40-1 at 20 degrees C. is stored beforehand in memory of the coil resistance calculator 28-1.

The resistance value ($R_t$) calculated by the coil resistance calculator 28-1 is transmitted to the calculator 24-1. The calculator 24-1 calculates the output voltage command value ($V_o$) on the basis of the resistance value ($R_t$) calculated by the coil resistance calculator 28-1 and the electric current command value ($I_o$) of the electric current command value signal S1. The output voltage command value ($V_o$) so calculated is transmitted as an output voltage command signal S15 to the adder 29-1.

The coil resistance calculator 28-1 receives a temperature signal S7 of the excitation coil 40-1 at regular time intervals to calculate the resistance value ($R_t$). Based on the resistance value ($R_t$) calculated at regular time intervals, the calculator 24-1 calculates an output voltage command value and transmits the output voltage command signal S15 to the adder 29-1. This enables the controller 20-1 to calculate the electric current of the excitation coil 40-1 on the basis of the appropriate output voltage command signal S15 in accordance with the temperature variation of the excitation coil 40-1.

As described above, the controller 20-1 of the third embodiment monitors the temperature of the excitation coil 40-1 and calculates the actual resistance value ($R_t$) of the excitation coil 40-1 on the basis of the actual temperature of the excitation coil 40-1. This enables the controller 20-1 to promptly bring the electric current flowing through the excitation coil 40-1, toward the electric current command value without increasing the proportional gain or an integration constant of the electric current difference calculator 22-1. In other words, the time (response time) required for the electric current flowing through the excitation coil 40-1 to reach the target electric current value (electric current command value) can be made shorter than that if the output voltage command value were calculated solely based on the difference. Since the excitation coil 40-1 is controlled based on the output voltage command value calculated by taking the resistance value of the excitation coil 40-1 into account, the time required to reach the target electric current value can be shortened with improved control precision, compared with the prior art (the difference between the target electric current value and the actual electric current value can be reduced). Further, there is no need to use a high-precision A/D or D/A converter, reducing the device cost.

The controller 20-1 calculates the output voltage command value on the basis of a calculated actual resistance value ($R_t$). This enables the controller 20-1 of the third embodiment to make an accurate estimate of the coil resistance value even in the event of a variation of the temperature of the excitation coil 40-1 due to disturbances, making it possible to output the output voltage command signal of improved accuracy that suits the actual temperature of the excitation coil 40-1. In this way, the controller 20-1 of the third embodiment can control electric current with improved stability and precision.

As with the controller 20-1 of the second embodiment, the controller 20-1 of the third embodiment takes into account the difference between the electric current value of the excitation coil 40-1 and the electric current command value, in addition to the resistance value ($R_t$), to calculate the output voltage command value. In this way, the electric current value flowing through the excitation coil 40-1 can be brought toward the electric current command value with precision on the basis of the difference between the electric current value of the excitation coil 40-1 and the electric current command value.

In the second and third embodiments, the temperature detector 41-1 and the electric-current detector 42-1 are separate from the controller 20-1. Instead, the temperature detector 41-1 and the electric-current detector 42-1 may be formed as part of the controller 20-1.

The constituent elements of the CPU electric-current controller 30-1 of FIGS. 11 and 13 may be realized, for example, by software stored in the CPU electric-current controller 30-1, except for the memory 23-1.

The electromagnet controller of the present invention may be applied to devices using magnetic force to create plasma, such as plasma etching devices, sputtering devices and CVD devices.

A. Fourth Embodiment

Figure 14:
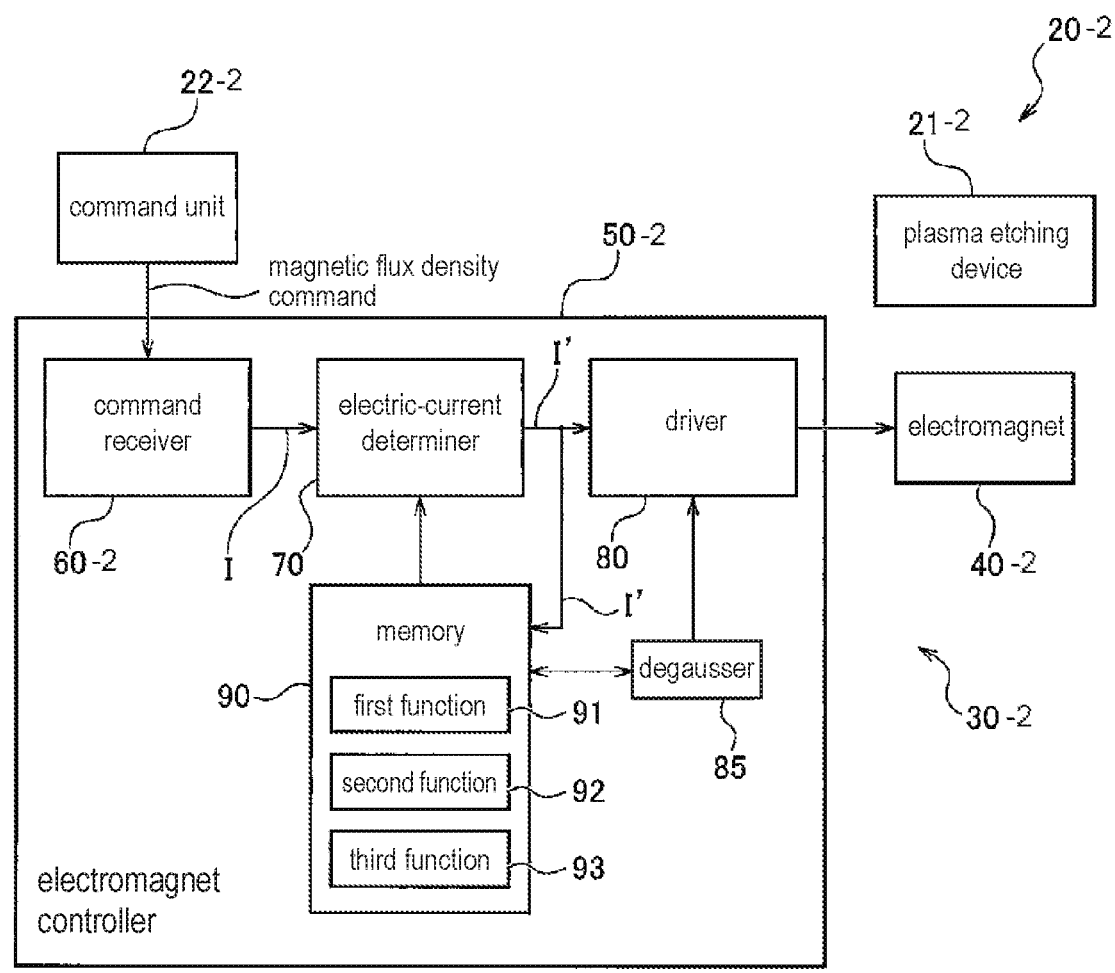
FIG. 14 is a block diagram of a schematic structure of a plasma etching system according to one embodiment of the present invention.

FIG. 14 is a block diagram of a schematic structure of the plasma processing system 20-1 according to an embodiment of the present invention. The plasma processing system 20-2 of this embodiment is a system for plasma etching used, for example, to etch substrates (e.g., wafers) in semiconductor manufacture. As shown in FIG. 14, the plasma processing system 20-2 comprises a plasma etching device 21-2, a command unit 22-2, and an electromagnet system 30-2. The plasma etching device 21-2 comprises a chamber (not shown). Plasma is created in the chamber so that the resultant ions and radicals are used to etch workpieces. The command unit 22-2 of this embodiment is a personal computer connected communicably to the electromagnet system 30-2 (more specifically, an electromagnet controller 50-2 to be described later). The command unit 22-2 may be any device, such as a sequencer, that sends a command to the electromagnet system 30-2.

The electromagnet system 30-2 comprises an electromagnet 40-2 and the electromagnet controller 50-2. The electromagnet 40-2 is provided on the outside of and adjacent to the above-described chamber to control the plasma density distribution in the plasma etching device 21-2 created by magnetic field set up by the electromagnet 40-2. Upon receiving a command from the command unit 22-2, the electromagnet controller 50-2 controls the electric current flowing through the electromagnet 40-2 to provide a desired magnetic flux density. To control the plasma density distribution in accordance with the processing conditions of the plasma etching device 21-2, the electromagnet controller 50-2 is configured to increase (or reduce) and control electric current (i.e., magnetic flux density) before a predetermined maximum (or minimum) electric current value (or magnetic flux density value) is reached.

Figure 15:
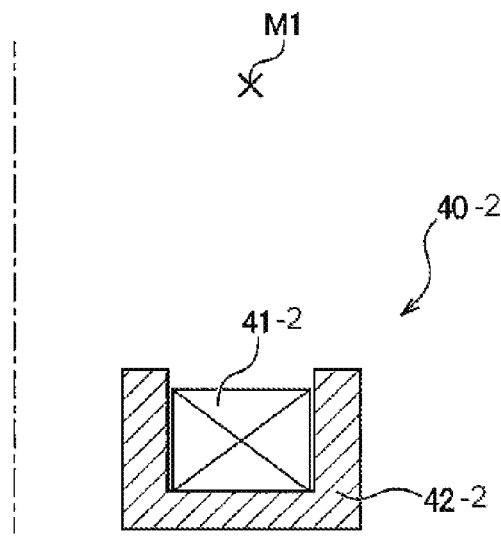
FIG. 15 is a partial cross-sectional view of a schematic structure of an electromagnet.

FIG. 15 is a cross-sectional view of a schematic structure of the electromagnet 40-2. The electromagnet 40-2 comprises a coil 41-2 and a yoke 42-2. This embodiment assumes for simplicity that the electromagnet 40-2 has only one coil 41-2. However, the electromagnet 40-2 may be provided with any number of coils 41-2. The coil 41-2 is circular in top view. FIG. 15 shows only one side of the center of the circle. In the electromagnet 40-2, the electric current flowing through the coil 41-2 is controlled to provide a desired magnetic flux density at measurement point M1 (a point in the chamber) a predetermined distance away from the coil 41-2.

The yoke 42-2 of magnetic material, however, has magnetic hysteresis. For this reason, if the electric current flowing through the coil 41-2 were calculated simply on the basis of a desired magnetic flux density (a magnetic flux density command value input from the command unit 22-2 in this embodiment), there would be a difference between the desired magnetic flux density and the magnetic flux density measured at measurement point M1, depending on the history of the electric current applied to the coil 41-2. The electromagnet controller 50-2 has a function of reducing such an effect of hysteresis (i.e., the discrepancy between the desired magnetic flux density and the magnetic flux density measured at measurement point M1).

As shown in FIG. 14, the electromagnet controller 50-2 comprises a command receiver 60-2, an electric-current determiner 70, a driver 80, a degausser 85, and memory 90. The command receiver 60-2 receives a magnetic flux density command value from the command unit 22-2. The command receiver 60-2 converts the received magnetic flux density command value to a value of electric current flowing through the coil 41-2 that assumes absence of hysteresis (i.e., assuming direct proportionality between the electric current flowing through the coil 41-2 and the magnetic flux density measured at measurement point M1). The electric current value so converted is also called electric current command value I. The command receiver 60-2 outputs the calculated electric current command value I to the electric-current determiner 70.

The electric-current determiner 70 takes into account the hysteresis of the electromagnet 40-2 to correct the electric current command value I and determine the actual electric current value flowing through the coil 41-2 (also called controlled electric current value I'). This process is based on first, second and third functions 91, 92, and 93. These functions are pre-stored in the memory 90. These functions may instead be obtained through communication from an external device (e.g., the command unit 22-2). Although, as will be described later, the second and third functions 92 and 93 may be transformed, depending on the situation, the electric-current determiner 70 may be configured to receive transformed functions from an external device through communication. These functions will be described later in detail.

The electric-current determiner 70 outputs the determined controlled electric current value I' to the driver 80. The driver 80 controls electric current supply to the coil 41-2. That is, the driver 80 applies the electric current of input controlled electric current value I' to the coil 41-2 of the electromagnet 40-2. The degausser 85 degausses the yoke 42-2. More specifically, upon receiving a degaussing command from the command unit 22-2, the degausser 85 of this embodiment retrieves a degaussing parameter (e.g., amplitude, frequency of alternating current demagnetization, etc.) from the memory 90. The degausser 85 outputs a command corresponding to the retrieved parameter to the driver 80.

The driver 80 converts the electric current to a desired waveform, based on the input command, and outputs the desired waveform.

Figure 16:
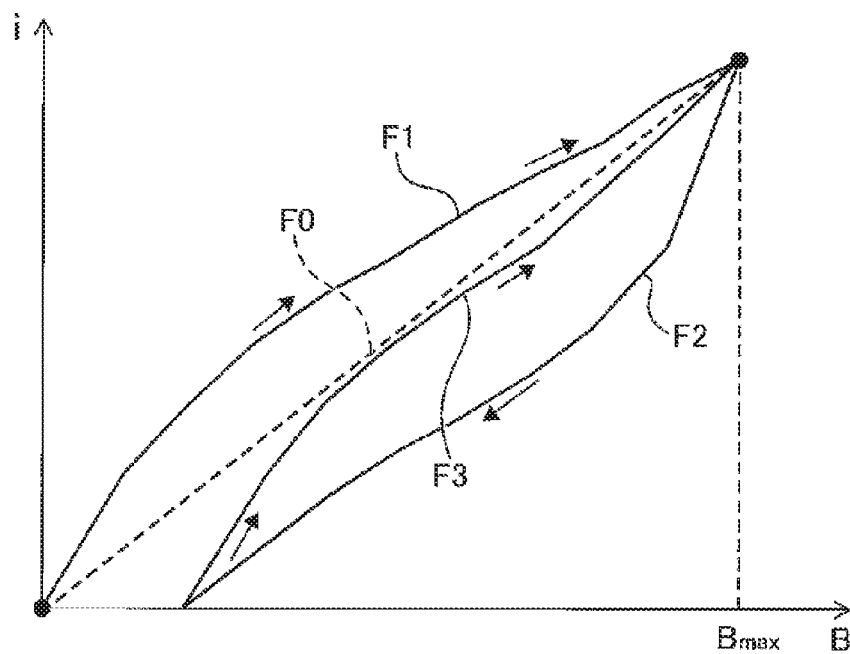
FIG. 16 describes a concept of determining a value of electric current on the basis of a function.

FIG. 16 shows the concept of determining the controlled electric current I' on the basis of the first, second, and third functions 91, 92, and 93. An ideal straight line F0 represents an ideal relationship (relationship without hysteresis) between the electric current flowing through the coil 41-2 and the magnetic flux density resulting from the electric current application. In the ideal straight line F0, electric current and magnetic flux density have a proportional relationship that passes through the origin. On the other hand, first, second, and third function lines F1, F2, and F3 conceptually represent a relationship between electric current and magnetic flux density after corrected with the effect of hysteresis taken into account. It is to be noted that the first, second, and third function lines F1, F2, and F3 of FIG. 16 are not direct graphical representations of the first, second, and third functions 91, 92, and 93, respectively, and conceptually show how the electric current command value I is corrected relative to the ideal straight line F0 by those functions. The first function line F1 is positioned above the ideal straight line F0. The second function line F2 is positioned below the ideal straight line F0. The third function line F3 is positioned above the second function line F2. In the example of FIG. 16, the third function line F3 is entirely positioned below the ideal straight line F0. However, depending on the material of the yoke 42-2, the third function line F3 may be in part positioned above the ideal straight line F0.

The function lines F1 to F3 are approximated by a result of actual measurement of a hysteresis property of the electromagnet 40-2 made in advance. The first, second, and third functions 91, 92, and 93 are so approximated as to obtain a determined electric current value on the function lines F1 to F3 as the controlled electric current value I'. This embodiment defines each of the first to third functions 91 to 93 as a piecewise linear function. In other words, the first, second, and third functions 91, 92, and 93, when graphically represented, each have a plurality of line segments connected at inflection points. However, the first, second, and third functions 91, 92, and 93 may be defined as a simple linear function having undefined intervals or any other function.

The first function 91 is used to increase the absolute value of magnetic flux density from the degaussed state of the yoke 42-2. The first function line F1 of FIG. 16, corresponding to the first function 91, is defined between the origin and a maximum value Bmax of magnetic flux density. In other words, the illustrated first function line F1 approximates the relationship between the electric current value flowing through the coil 41-2 and the magnetic flux density at measurement point M1 when the electric current increases in a certain width from zero electric current value to the electric current value (electric current value Imax) corresponding to the maximum value Bmax.

The second function 92 is used to decrease the absolute value of magnetic flux density from the magnetized state of the yoke 42-2. The second function line F2 of FIG. 16, corresponding to the second function 92, is defined between the maximum value Bmax and a point on the x-axis (zero electric current value). In other words, the illustrated second function line F2 approximates the relationship between the electric current value flowing through the coil 41-2 and the magnetic flux density measured at measurement point M1 when decreasing in a certain width from the electric current value corresponding to the maximum value Bmax to zero electric current value.

The third function 93 is used to increase the absolute value of magnetic flux density form the magnetized state of the yoke 42-2. The third function line F3 of FIG. 16, corresponding to the third function 93, is defined between a point on the x-axis (zero electric current value) and the maximum value Bmax. The illustrated third function line F3 approximates the relationship between the electric current value flowing through the coil 41-2 and the magnetic flux density measured at measurement point M1 when a decrease in electric current from the electric current value corresponding to the maximum value Bmax to zero electric current value is followed again by an increase in electric current to the electric current value corresponding to the maximum value Bmax in a certain width.

It is to be noted that although FIG. 16 shows only the first quadrant, a graph line symmetrical with the line of FIG. 16 with respect to the origin can be obtained for each of the second to fourth quadrants, and the first to third functions 91 to 93 are defined accordingly.

Figure 17:
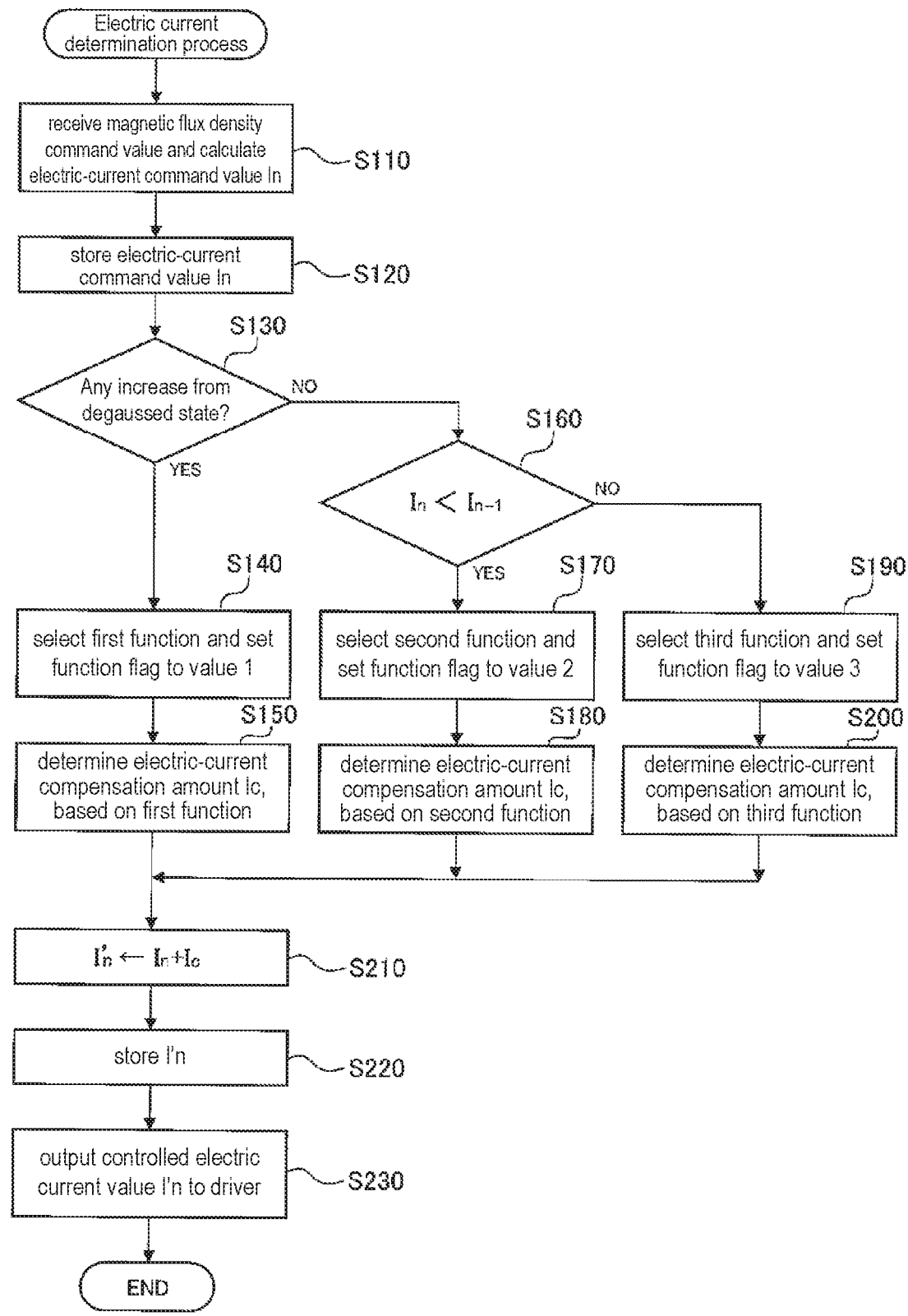
FIG. 17 is a flowchart of a sequence of a process of determining a value of electric current.

FIG. 17 is a flowchart of an example of flow of electric current value determination process executed by the electromagnet controller 50-2. The electric current value determination process determines a value of electric current applied to the coil 41-2, based on a command value input from the command unit 22-2. The electric current value determination process is repeatedly performed each time a command value is input from the command unit 22-2 to the electromagnet controller 50-2. For simplicity of description, FIG. 17 shows that the electric current value and magnetic flux density value are each controlled in a range above zero (i.e., the range of first quadrant of FIG. 16). At the beginning of the electric current value determination process, the command receiver 60-2 receives a magnetic flux density command value input from the command unit 22-2 and calculates an electric current command value $I_n$ (step S110). The suffix "n" added to the electric current command value I indicates the nth input magnetic flux density command value. The electric current command value $I_n$ is calculated on the basis of the ideal straight line F0 of FIG. 16.

Upon calculating the electric current command value $I_n$, the command receiver 60-2 stores the calculated electric current command value $I_n$ in memory 90 (step S120) and outputs the electric current command value $I_n$ to an electric-current determiner 70. In this embodiment, the electric current command value $I_n$ stored in the memory 90 is deleted at the end of the next electric current value determination process to be executed.

The electric-current determiner 70 determines whether the input electric current command value $I_n$ represents a command for an increase in magnetic flux density from the degaussed state (step S130). The "command for an increase in magnetic flux density from the degaussed state" means the command for an increase in magnetic flux density from the initial condition (i.e., absence of residual magnetic field) and a command for magnetic flux density increase at an intermediate stage in the course of a gradual magnetic flux density increase without having reduced the magnetic flux density since the initial condition. This determination is made in this embodiment, based on whether an electric current command value $I_{n-1}$ is stored in step S120 of the previous electric current value determination process and on a function flag to be described later. In the case that the electric current value determination process is executed for the first time, no electric current command value $I_{n-1}$ is stored. In this embodiment, the electric current command value $I_n$ stored in the memory 90 is deleted when degaussing is performed by the degausser 85 after the nth electric current value determination process. This enables the electric-current determiner 70 to determine whether an input electric current command value $I_n$ represents the first magnetic flux density increase from the initial condition, based on whether the electric current command value $I_{n-1}$ is stored in the memory 90. Whether the input electric current command value $I_n$ indicates a magnetic flux density increase at an intermediate stage can be determined from a function flag described later. This determination will be described later.

If, as a result of the determination, the electric current command value $I_n$ indicates an command for magnetic flux density increase from the degaussed state (step S130: YES), the electric-current determiner 70 will select the first function 91 and set the function flag to value 1 (step S140). The function flag is written in a flag location in the memory 90. The use of this function flag will be described later. Next, the electric-current determiner 70 determines an electric current correction amount $I_c$ from the first function 91 (step S150). In this embodiment, the first function 91 represents the correspondence between the electric current command value I and the electric current correction amount $I_c$. This is also the case with the second and third functions 92 and 93. The determination of the electric current correction amount $I_c$ will be described later. The electric-current determiner 70 subsequently adds the electric current correction amount $I_c$ to the electric current command value $I_n$ calculated in the above-described step S110 to calculate a controlled electric current value $I_{n'}$ (step S210). The electric-current determiner 70 stores the controlled electric current value $I_{n'}$ in the memory 90 (step S220) and outputs the controlled electric current value $I_{n'}$ to the driver 80 (step S230) to terminate the electric current value determination process.

On the other hand, if the electric current command value $I_n$ does not indicate a command for magnetic flux density increase from the degaussed state (step S130: NO), that is, if the yoke 42-2 is in its magnetized state, the electric-current determiner 70 will determine whether the electric current command value $I_n$ is below the electric current command value $I_{n-1}$ (step S160). The electric current command value $I_{n-1}$ is stored in the memory 90 in the above-described step S120 of the previous electric current value determination process. If the result of the determination shows that the electric current command value $I_n$ is below the electric current command value $I_{n-1}$ (step S160: YES), that is, if a command for magnetic flux density decrease is input, the electric-current determiner 70 will select the second function 92 and set the function flag to value 2 (step S170). Next, the electric-current determiner 70 determines the electric current correction amount $I_c$ on the basis of the second function 92 (step S180). How to determine the electric current correction amount $I_c$ will be described later. The electric-current determiner 70 proceeds to the step S210.

If the result of determination indicates that the electric current command value $I_n$ is greater than the electric current command value $I_{n-1}$ (step S160: NO), that is, if a command for magnetic flux density increase is input, the electric-current determiner 70 will selects the third function 93 and set the function flag to value 3 (step S190). Next, the electric-current determiner 70 determines the electric current correction amount $I_c$ on the basis of the third function 93 (step S200). How to determine the electric current correction amount $I_c$ will be described later. The electric-current determiner 70 then proceeds to the step S210.

Figure 18:
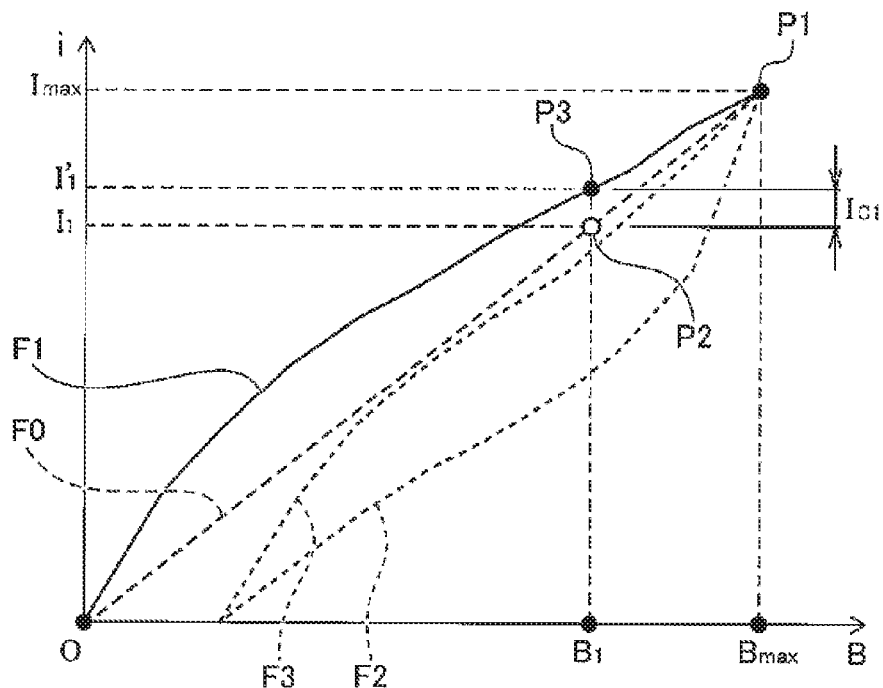
FIG. 18 is a schematic diagram depicting a concept of determining the value of electric current in increasing a magnetic flux density from a degaussed state.

FIGS. 18 to 23 conceptually describe a specific example of how to determine the electric current correction amount $I_c$ in the above steps S150, S180, and S200. FIG. 18 shows a concept of determining an electric current value for a magnetic flux density increase from the degaussed state, corresponding to the above step S150. As shown in FIG. 18, once a magnetic flux density command value B smaller than the maximum value Bmax is input, the electromagnet controller 50-2 calculates the electric current command value I1, using an ideal straight line F0 (step S110). In FIG. 18, point P1 is a point on the ideal straight line F0 corresponding to the maximum value Bmax. Point P2 is a point on the ideal straight line F0 determined by a magnetic flux density command value B1 and corresponds to the electric current command value I1. The electromagnet controller 50-2 uses the first function 91 to determine the electric current correction amount $I_{c1}$ (step S150) and adds the electric current command value I1 to the determined electric current correction amount $I_{c1}$ to calculate a controlled electric current I'1. P3 lies on the function line F1 and corresponds to the magnetic flux density command value B1 and controlled electric current I'1. To increase the magnetic flux density from the degaussed state to the magnetic flux density command value B1, the electric current value is increased from zero to the controlled electric current value I'1 corresponding to point P3 on the first function line F1. To obtain such a result, the correspondence between the electric current command value I and the electric current correction amount $I_c$ is defined in the first function 91.

Figure 19:
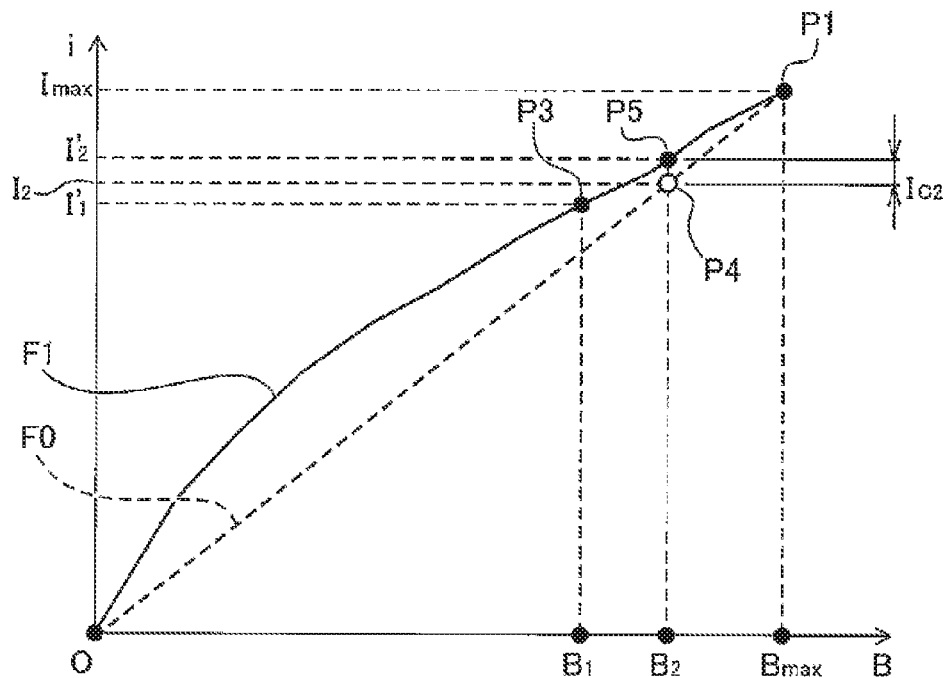
FIG. 19 is a schematic diagram depicting a concept of determining the value of electric current in further increasing the magnetic flux density from the state of FIG. 18.

FIG. 19 shows a concept of determining the electric current value to further increase the magnetic flux density from the state of FIG. 18. Upon an input of a magnetic flux density command value B2 (B2>B1), the electromagnet controller 50-2 uses the ideal straight line F0 to calculate an electric current command value I2 (corresponding to point P4) (step S110). The electromagnet controller 50-2 then determines an electric current correction amount $I_{c2}$, using the first function 91 (step S150), and adds the electric current command value I2 to the electric current correction amount $I_{c2}$ to yield a controlled electric current value I'2 (corresponding to point P5). In other words, as long as the magnetic flux density command value being input continues to increase from the degaussed state, the controlled electric current value I' is determined as a value corresponding to a point on the first function line F1, using the first function 91 continuously. Whether the magnetic flux density command value being input continues to increase from the degaussed state can be determined by reference to the function flag. Specifically, when a magnetic flux density command value greater than the previous one is input while the function flag is set to value 1, it can be determined that the magnetic flux density command value being input continues to increase from the degaussed state.

Figure 20:
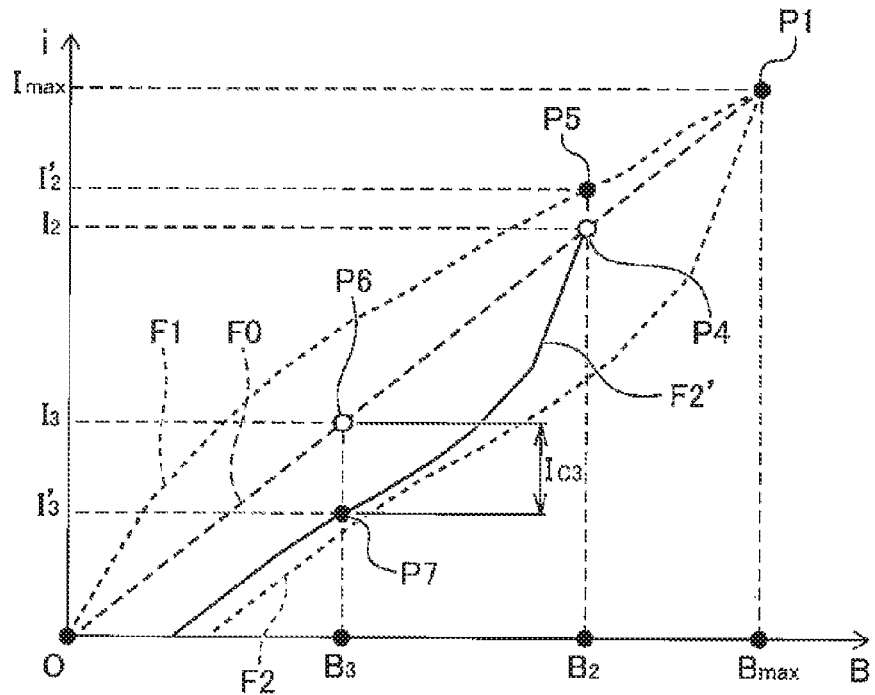
FIG. 20 is a schematic diagram depicting a concept of determining the value of electric current in decreasing the magnetic flux density from the magnetized state.

FIG. 20 is a concept of determining the electric current value in the case of decreasing the magnetic flux density from the magnetized state. When a magnetic flux density command value B3 (B3<B2) is input from the state of FIG. 19, that is, when the magnetic flux density command value is switched from increase to decrease, the electromagnet controller 50-2 will calculate an electric current command value I3 (corresponding to point P6), using the ideal straight line F0 (step S110). The electromagnet controller 50-2 then determines the electric current correction amount $I_{c3}$ on the basis of the second function 92 (step S150) and adds the electric current command value I3 to the electric current correction amount $I_{c3}$ to calculate a controlled electric current value I'3 (corresponding to point P7). Point P7 lies on a second function transform line F2'. Since the second function transform line F2' is positioned below the ideal straight line F0, the electric current correction amount $I_{c3}$ is determined as a negative value.

The second function transform line F2' is a line transformed from the second function line F2. Specifically, the second function transform line F2' is a line transformed so as to lie between the second function line F2 and the ideal straight line F0. For example, the second function transform line F2' is derived in the following manner. First, the second function line F2 is translated so that point P1 (an end of the second function line opposite to the origin) coincides with P4 (a point on the ideal straight line F0 corresponding to the electric current command value I where the magnetic flux density (or current) shifts from increase to decrease). As shown in FIG. 20, the second function line F2 so translated is contracted. The rate of contraction in this case is B2/Bmax.

The electric current correction amount $I_{c3}$ is so determined so that the controlled electric current value I'3 lies on the second function transform line F2'. In other words, the second function 92 is used after it is transformed to obtain such a result. This transformation of the second function 92 can be made by multiplying at least one of the terms of the second function (e.g., the first term and a constant in the case of a linear function) by a predetermined coefficient. In the case that the second function 92 is defined for each segment, as in this embodiment, the segments are also contracted.

Figure 21:
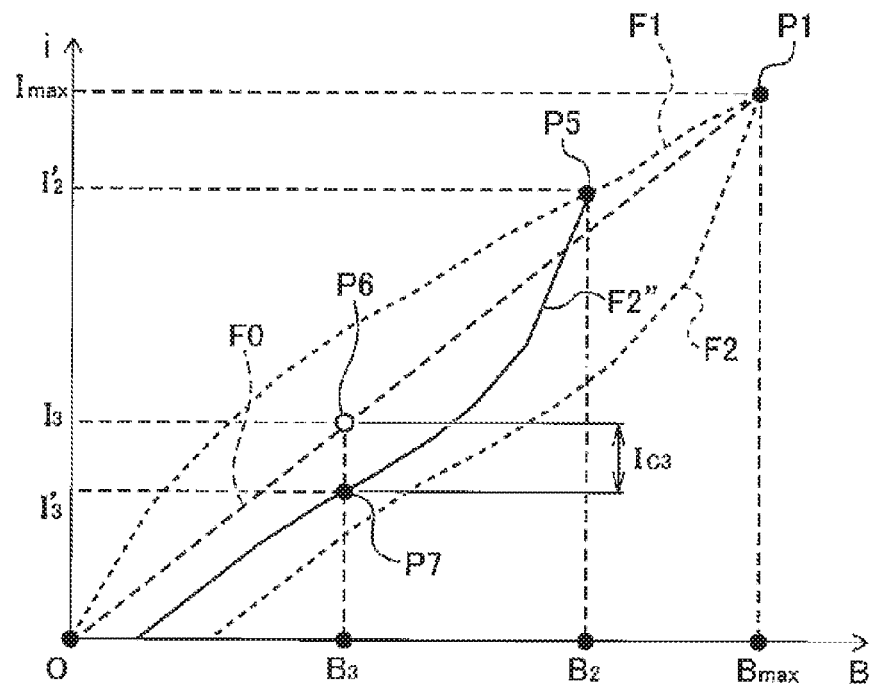
FIG. 21 is a schematic diagram depicting another concept of determining the value of electric current in decreasing the magnetic flux density from the magnetized state.

FIG. 21 shows another example of the concept of determining the electric current value in the case of reducing the magnetic flux density from the magnetized state. In this example, the second function transform line F2 of FIG. 20 is replaced with a second function transform line F2". This second function transform line F2" is derived in the following manner. First, the second function line F2 is translated to put point P1 to point P5 (a point on the first function line F1 corresponding to the magnetic flux density B2 where the magnetic flux density turns from increase to decrease). The second function line F2 so translated is contracted. The rate of contraction in this case is B2/Bmax. The use of the second function transform line F2" having one end at a point on the first function line F1 corresponding to the magnetic flux density B2 where the magnetic flux density turns from increase to decrease can improve accuracy in correction of magnetic flux density.

After the state of FIG. 20 (or FIG. 21), as long as the magnetic flux density command value being input continues to decrease, the controlled electric current value I' is determined as a value corresponding to a point on the second function transform line F2' (or the second function transform line F2"), using the same function (the above-described transformed second function 92). Whether the magnetic flux density command value being input continues to decrease from the magnetized state can be determined by reference to the function flag. Specifically, when a magnetic flux density command value smaller than the previous one is input while the function flag is set to value 2, it can be determined that the magnetic flux density command value being input continues to decrease from the magnetized state. In the case that the magnetic flux density command value shifts from increase to decease after having reached point P1, the controlled electric current value I' is determined so that it lies, not on the second function transform line F2' (nor the second function transform line F2"), but on the second function line F2.

Figure 22:
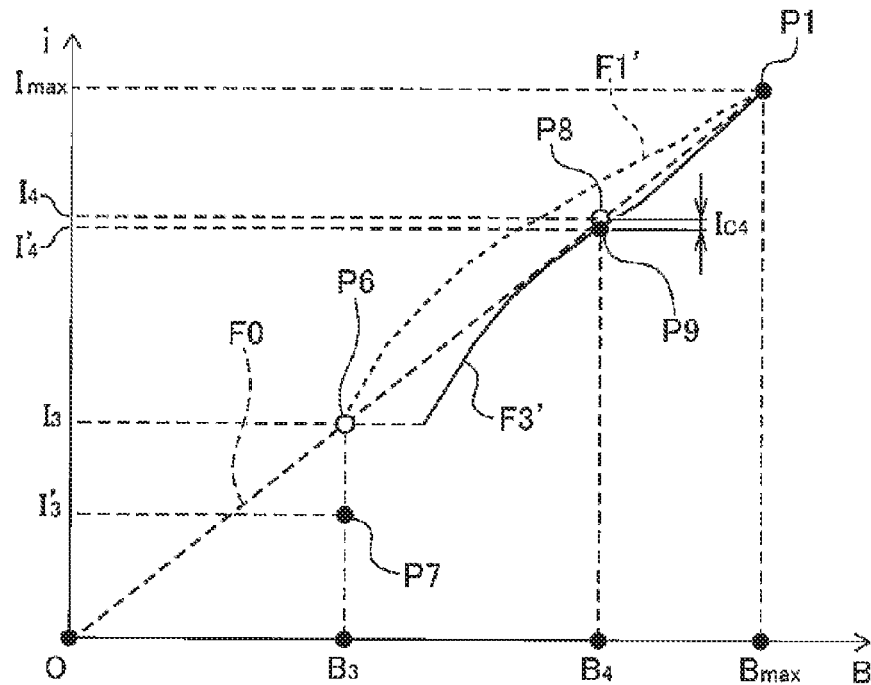
FIG. 22 is a schematic diagram depicting a concept of determining the value of electric current in increasing the magnetic current flux from the magnetized state.

FIG. 22 shows a concept of determining the electric current value in the case of increasing the magnetic flux density from the magnetized state. When a magnetic flux density command value B4 (B4>B3) is input from the state of FIG. 20, that is, when in the magnetized state the magnetic flux density command value switches back from decrease to increase, the electromagnet controller 50-2 calculates the electric current command value I4 (corresponding to point P8), using the ideal straight line F0 (step S110). Whether in the magnetized state the magnetic flux density command value switches back from decrease to increase can be determined by reference to the function flag. Specifically, when a magnetic flux density command value greater than the previous one is input while the function flag is set to value 2, it can be determined that in the magnetized state the magnetic flux density command value has switched back from decrease to increase.

The electromagnet controller 50-2 determines the electric current correction amount $I_{c4}$ on the basis of the third function 93 (step S150) and adds the electric current command value I4 to the determined electric current correction amount $I_{c4}$ to yield a controlled electric current value I'4 (corresponding to point P9). Point P9 lies on the third function transform line F3'. Since the third function transform line F3' lies below the ideal straight line F0, the electric current correction amount Ic4 takes a negative value.

The third function transform line F3' is a line transformed from the third function line F3. The third function transform line F3' can be derived, for example, in the following manner. First, the first function line F1 and the third function line F3 are translated so as to put the end of the first function line F1 on the origin side at point P6 (a point on the ideal straight line F0 corresponding to the electric current command value I where the magnetic flux density (or current) shifts from decrease to increase). Then, as shown in FIG. 22, the translated first function line F1 and third function line F3 are contracted. The rate of contraction in this case is (Bmax−B3)/Bmax. Of the first function line F1 and the third function line F3 so contracted, the latter represents a third function transform line F3'. In the example of FIG. 22, the third function transform line F3' lies entirely below the ideal straight line F0. However, depending on the shape of the third function line F3, the third function transform line F3' may lie in part above the ideal straight line F0.

The electric current correction amount $I_{c4}$ is determined so that the controlled electric current value I'4 lies on the third function transform line F3'. In other words, the third function 93 is used after it is transformed to obtain such a result. This transformation of the second function 93 can be made by multiplying at least one of the terms of the third function by a predetermined coefficient. In the case that the third function 93 is defined for each segment, as in this embodiment, the segments are also contracted.

Figure 23:
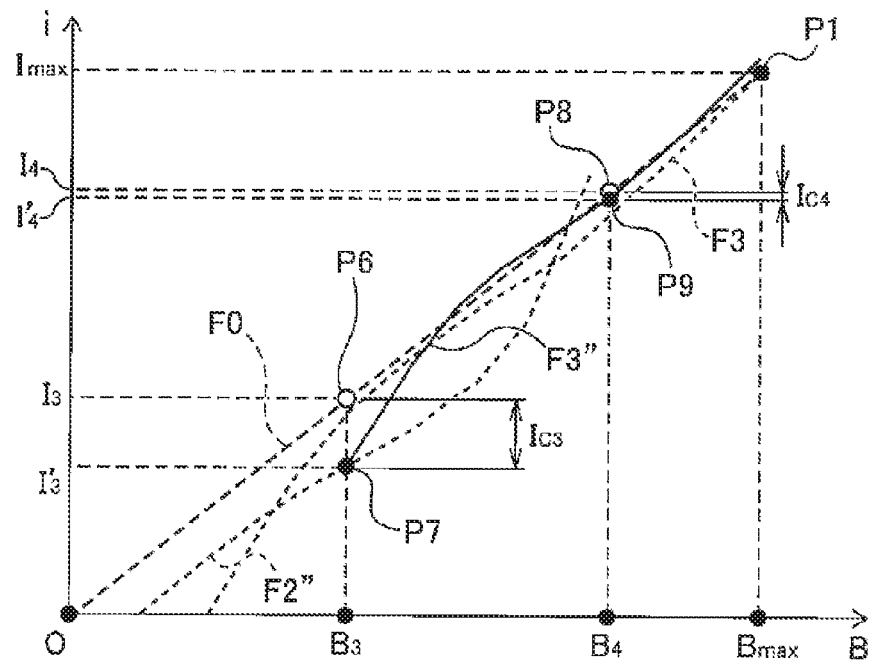
FIG. 23 is a schematic diagram depicting another concept of determining the value of electric current in increasing the magnetic flux density from the magnetized state.

FIG. 23 shows another example of the concept of determining the electric current value in the case of increasing the magnetic flux density from the magnetized state. In this example, the third function transform line F3' of FIG. 22 is replaced with a third function transform line F3". FIG. 23 shows that at point P7 of FIG. 21 the magnetic flux density shifts from decrease to increase. This third function transform line F3" is derived in the following manner. First, the third function line F3 is translated to bring the end on the origin side of the third function line F3 to point P7 (a point on the second function transform line F2" where the magnetic flux density turns from decrease to increase). The third function line F3 so translated is contracted. The rate of contraction in this case is (Bmax−B3)/Bmax. The use of the third function transform line F3" having one end at a point on the second function line F2" corresponding to the magnetic flux density B3 where the magnetic flux density turns from decrease to increase can improve accuracy in correction of magnetic flux density.

After the state of FIG. 22 (or FIG. 23), as long as the magnetic flux density command value being input continues to increase in the magnetized state, the controlled electric current value I' is determined as a value corresponding to a point on the third function transform line F3' (or the third function transform line F3"), using the same function (the above-described transformed third function 93). Whether the magnetic flux density command value continues to increase in the magnetized state can be determined by reference to the function flag. Specifically, when a magnetic flux density command value greater than the previous one is input while the function flag is set to value 3, it can be determined that the magnetic flux density command value continues to increase in the magnetized state. In the case that the magnetic flux density shifts back to decease (which can be determined from the function flag), as in FIGS. 20 and 21, the controlled electric current value I' is determined so that it lies on a line transformed from the second function line F2. In the case the magnetic flux density command value switches from decrease to increase after having reached the minimum value (on the x-axis) of the second function line F2, the controlled electric current value I' is determined so that it lies, not on the third function transform line F3' or F3", but on the third function line F3. Although the details are omitted, the controlled electric current value I' is determined for the second to fourth quadrants in the same manner as for the first quadrant.

The above-described plasma processing system 20-2 reduces the effect of residual magnetic field resulting from hysteresis, regardless of history of application of electric current, by selectively using the three functions 91, 92, and 93 according to history of application of electric current to the coil 41-2 to control the electric current flowing through the coil 41-2. In other words, the magnetic flux density command value and the actual magnetic flux density value when electric current flows through the coil 41-2 can be brought into conformity with greater accuracy than the prior art. This results in an improvement in reproducibility of process use conditions for identical plasma processing systems 20-2 and a reduction in performance differences among individual plasma processing systems 20-2 of identical specifications. Further, regardless of the degree of hysteresis of the yoke 42-2, the magnetic flux density command value and the actual magnetic flux density value can be accurately brought into conformity. This eliminates the need for using a material with low hysteresis for the yoke 42-2. As a result, a readily available inexpensive material can be used for the yoke 42-2. This reduces the cost of the plasma processing system 20-2 and the time it takes from ordering to reception of the plasma processing system 20-2.

Since the three functions 91, 92, and 93 are set up as a piecewise linear function, precision control within a tolerance on magnetic flux density can be achieved without going through extensive numerical analysis for minor loop calculations. In other words, it is possible to ensure both a reduction in operation load and precision in control of magnetic flux density.

After degaussing by the degausser 85, electric current (controlled electric current value I') applied to the coil 41-2 can be determined from the first function 91. Increasing or decreasing the magnetic flux density from the degaussed state does not require transformation of the first function 91 for calculation of the controlled electric current value I'. Such increase or decrease can be made more simply than in the case of increasing or decreasing the magnetic flux density from the magnetized state, that is, in the case of determining the controlled electric current value I' using functions transformed from the functions 92, 93 (transformation is not necessarily required but is preferably made for improved accuracy in control of magnetic flux density). As a result, operation load on the electromagnet controller 50-2 can be reduced by timed degaussing. Such degaussing can be timed appropriately by taking into account the balance between operation load reduction and throughput of the plasma processing system 20-2. For example, the degausser 85 may be configured to perform degaussing, only at the startup of the plasma processing system 20-2. Instead of or in addition to this, the degausser 85 may degauss when standby time for the plasma etching device 21-2 has occurred in processing workpieces.

In increasing or decreasing the magnetic flux density from the magnetized state, precision control of magnetic flux density can be ensured within a certain range, according to history of application of electric current, by transformation of the stored functions 92, 93 and simple approximation. This leads to a reduction in operation load on the electromagnet controller 50-2. In the case of a shift of the magnetic flux density command signal from increase to decrease or the other way around in particular, the functions 92, 93 are retransformed to ensure sufficient control precision in magnetic flux density.

B. Fifth Embodiment

Figure 24:
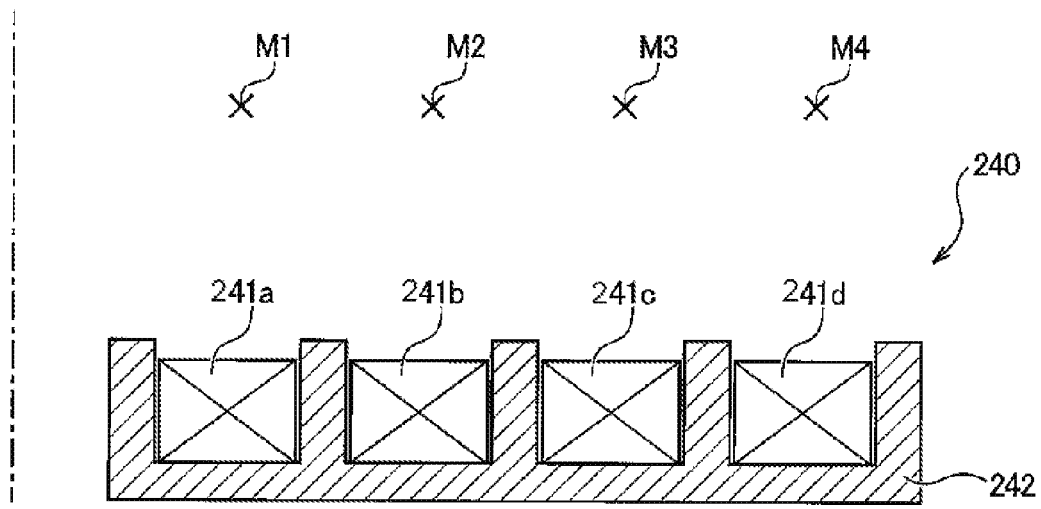
FIG. 24 is a partial cross-sectional view of a schematic structure of the electromagnet according to a fifth embodiment.

Now, the fifth embodiment of the present invention will be described. The plasma processing system 20-2 of the fifth embodiment has an electromagnet 240, instead of the electromagnet 40-2. Below, only the details of the fifth embodiment that differ from those of the fourth embodiment are described. The details of the fifth embodiment omitted below are the same as those of the fourth embodiment. As shown in FIG. 24, the electromagnet 240 comprises four coils 241a to 241d and a yoke 242. The number of coils is not limited to four and may be any number greater than or equal to two. The coils 241a to 241d are circular in top view and arranged concentrically. FIG. 24 shows only one side of the center of the circle. The coils 241a to 241d of the electromagnet 240 are controlled in electric current therethrough to provide a desired magnetic flux density at measurement points M1 to M4 a certain distance away from the four coils 241a to 241d. The measurements point M1 to M4 correspond to the coils 241a to 241d, respectively. The electric-current determiner 70 is configured to determine a value of electric current for the coils 241a to 241d that reflects the effect of magnetic fields generated by the coils 241a to 241d. In other words, the electric-current determiner 70 is configured to determine a value of electric current applied to the coils 241a to 241d so as to provide a magnetic flux density at the measurement point corresponding to one coil which density is equal to an expected magnetic flux density at that measurement point minus the densities of magnetic fluxes coming from the other coils affecting that measurement point.

Figure 25:
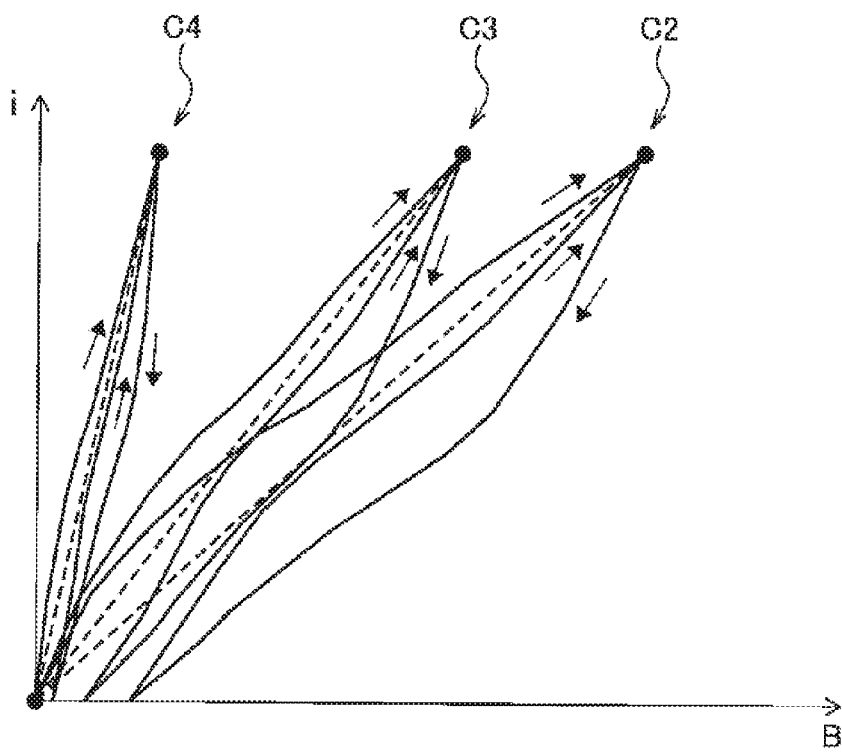
FIG. 25 is a conceptual view of an example for a correction of a magnetic flux density at measurement point M1.

In this embodiment, the coils 241a to 241d form respective flux paths independent of one another. The functions 91, 92, 93 are transformed before use to take into account the effect of magnetic fields forming those flux paths on the magnetic flux densities at the measurement points M1 to M4. FIG. 25 shows a concept of compensating for the effect of magnetic fields emanating from the coils 241b to 241d at measurement point M1 corresponding to the coil 241a. The effect of the magnetic fields from the coils 241b to 241d at measurement point M1 is taken into account, using function line groups C2 to C4. The function line groups C2 to C4, respectively, represent the relationships between the electric currents flowing through the coils 241b to 241d and the resultant magnetic fields at measurement point M1, with the effect of hysteresis taken into account. The function line group C2 corresponds to the coil 241b, the function line group C3 to the coil 241c, and the function line group C4 to the coil 241d. In concept, the function line groups C2 to C4 are ones that are formed by contracting and rotating the function lines F1 to F3 corresponding to the functions 91, 92, 93 of FIG. 16. Since the distance from measurement point M1 to the coils 241b, 241c, 241d increases in the order: the coils 241b, 241c, and 241d, the function line groups C2 to C4 are set to decrease in magnetic flux density in this order for the same electric current value. Similarly, the effect of hysteresis decreases in the order: the function line groups C2, C3, and C4 (the distance between the function lines forming those function line groups and an ideal straight line also decreases).

Figure 26:
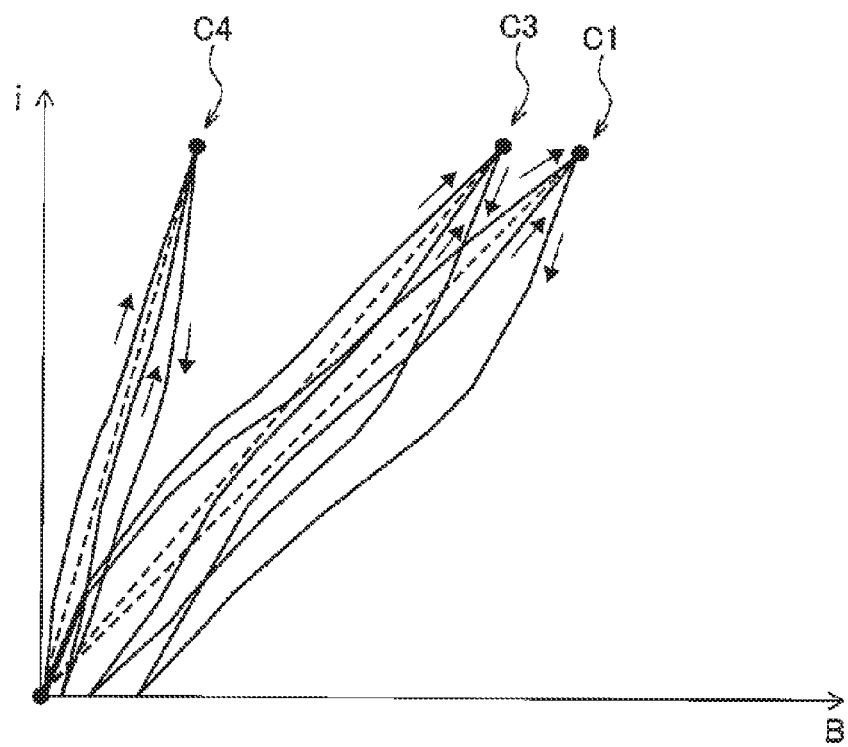
FIG. 26 is a conceptual view of an example for a correction of a magnetic flux density at measurement point M2.

FIG. 26 shows a concept of compensating for the effect of magnetic fields from the coils 241a, 241c, 241d at measurement point M2 corresponding to the coil 241b. Since the distance from measurement point M2 to the coil 241d is greater than the distances from measurement point M2 to coils 241a, 241c, the function line group C4 is so set that its magnetic flux density is smaller for the same electric current value than those of the function line groups C1, C3.

Figure 27:
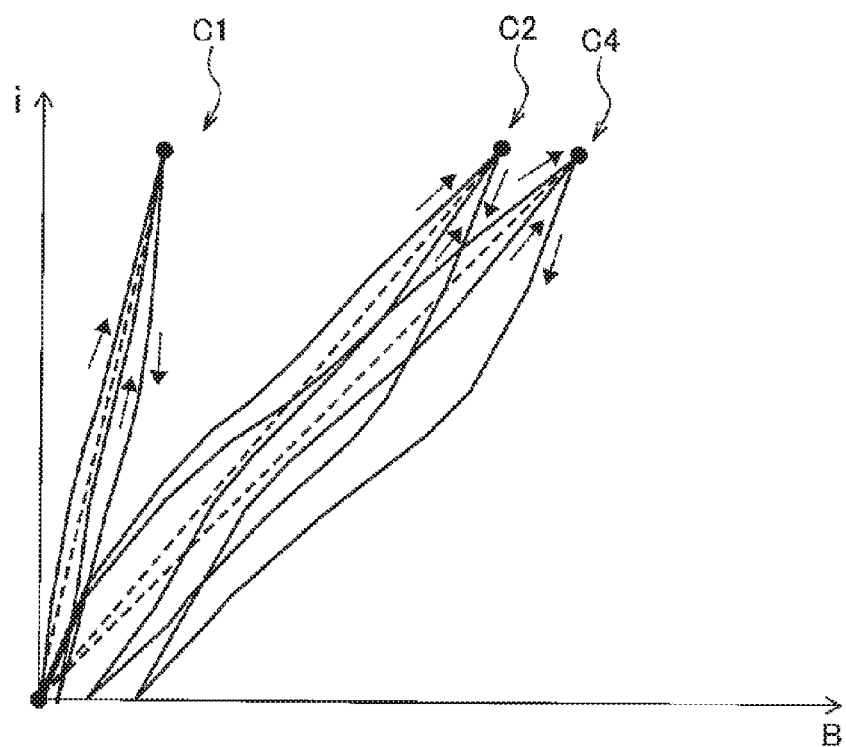
FIG. 27 is a conceptual view of an example for a correction of a magnetic flux density at measurement point M3.

FIG. 27 shows a concept of compensation for the effect of magnetic fields from the coils 241a, 241b, 241d at measurement point M3 corresponding to the coil 241c. Since the distance from measurement point M3 to the coil 241a is greater than the distances from measurement point M3 to coils 241b, 241d, the function line group C1 is so set that its magnetic flux density is smaller for the same electric current value than those of the function line groups C2, C4.

Figures 28, 29A, 29B:
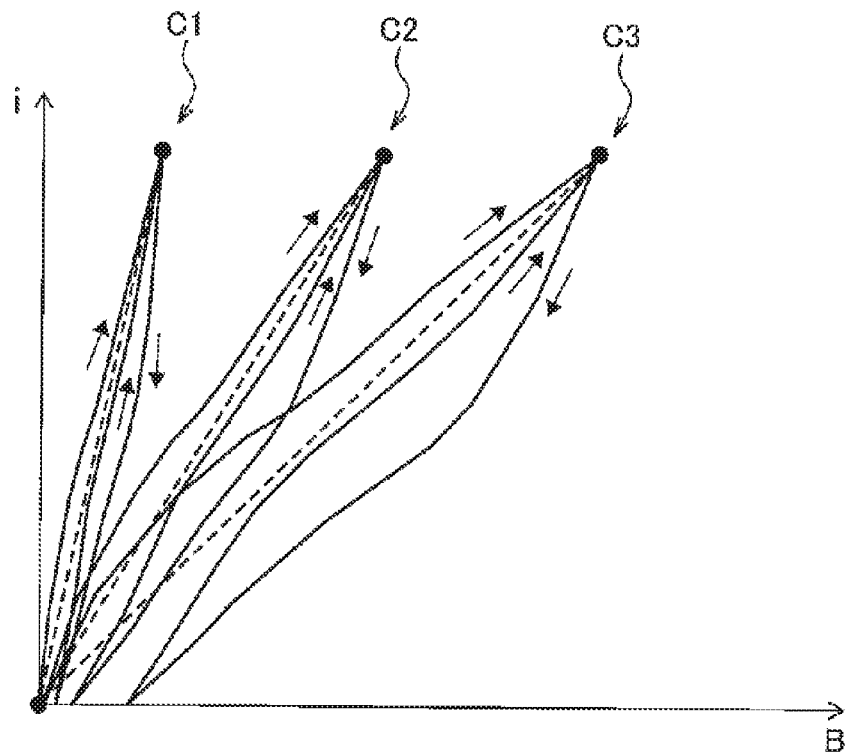
FIG. 28 is a conceptual view of an example for a correction of a magnetic flux density at measurement point M4.
FIG. 29A describes an example of a method taking into account mutual interference between coils according to a sixth embodiment.
FIG. 29B describes another example of a method taking into account mutual interference between coils according to the sixth embodiment.

FIG. 28 shows a concept of compensation for the effect of magnetic fields from the coils 241a, 241b, 241c at measurement point M4 corresponding to the coil 241d. Since the distance from measurement point M4 to the coils 241a, 241b, 241c increases in the order: 241c, 241b, and 241a, the function line groups C1 to C3 are set to decrease in magnetic flux density for the same electric current value in the order: C3, C2, and C1.

The above-described function line groups C1 to C4 are set by actually measuring in advance the effect, at each of measurement points M1 to M4, of the three coils, other than the coil under measurement, and approximating the measurement result to a certain function. The functions corresponding to the function line groups C1 to C4 are approximated by transformation of the functions 91, 92, 93.

The functions derived by such transformation of the functions 91, 92, 93 are added before use for the measurement point under consideration. For example, in the case of controlling the electric current flowing through the coil 241a to provide a desired magnetic flux density at measurement point M1, the function 91 itself derived as described in the fourth embodiment or the function transformed from the functions 92, 93 and transformed functions corresponding to the three function lines of FIG. 25 are added to form a function that is in turn used to determine the controlled electric current value I'. Such addition of functions representing the known effect of magnetic fields from coils enables the electric current flowing through the coil 241a to be determined with accuracy by taking into account the effect of magnetic fields from the coils 241b to 241d. The approximation of functions representing the effect of magnetic fields from coils by transformation of the functions 91, 92, 93 reduces the memory capacity of the memory 90 which is finite.

C. Sixth Embodiment

Moving on to the sixth embodiment of the present invention, the plasma processing system 20-2 of the sixth embodiment has the same structure as that of the fifth embodiment. The only difference between the sixth and fifth embodiments is that when at least two of the coils 241a to 241d form identical flux paths, the sixth embodiment determines the electric currents flowing through the coils 241a to 241d, with mutual interference of magnetic fields resulting from the identical flux paths taken into account. Below, only this feature of the sixth embodiment is described.

As shown in FIG. 29A, the coils 241a to 241d are assigned functions A to L (at least some of these functions may be replaced with a coefficient) that reflects the effects of the other coils. For example, function A in the row of the coil 241a and the column of the coil 241b represents a function that reflects the effect of the coil 241b at measurement point M1 corresponding to the coil 24a. Functions A to L are approximated in advance on the basis of actual measurements. Then, the matrix of FIG. 29B is used to further change the controlled electric current value I' (the value of electric current corrected on the basis of the functions 91, 92, 93 in the fourth embodiment) to the corrected electric current control value I''. In FIG. 29B, the suffixes a to d denote the coils 241a to 241d, respectively. In this way, precision control of magnetic flux density can be achieved by taking into account mutual interference caused by at least two of the coils 241a to 241d forming identical flux paths.

D. Seventh Embodiment

Figure 30:
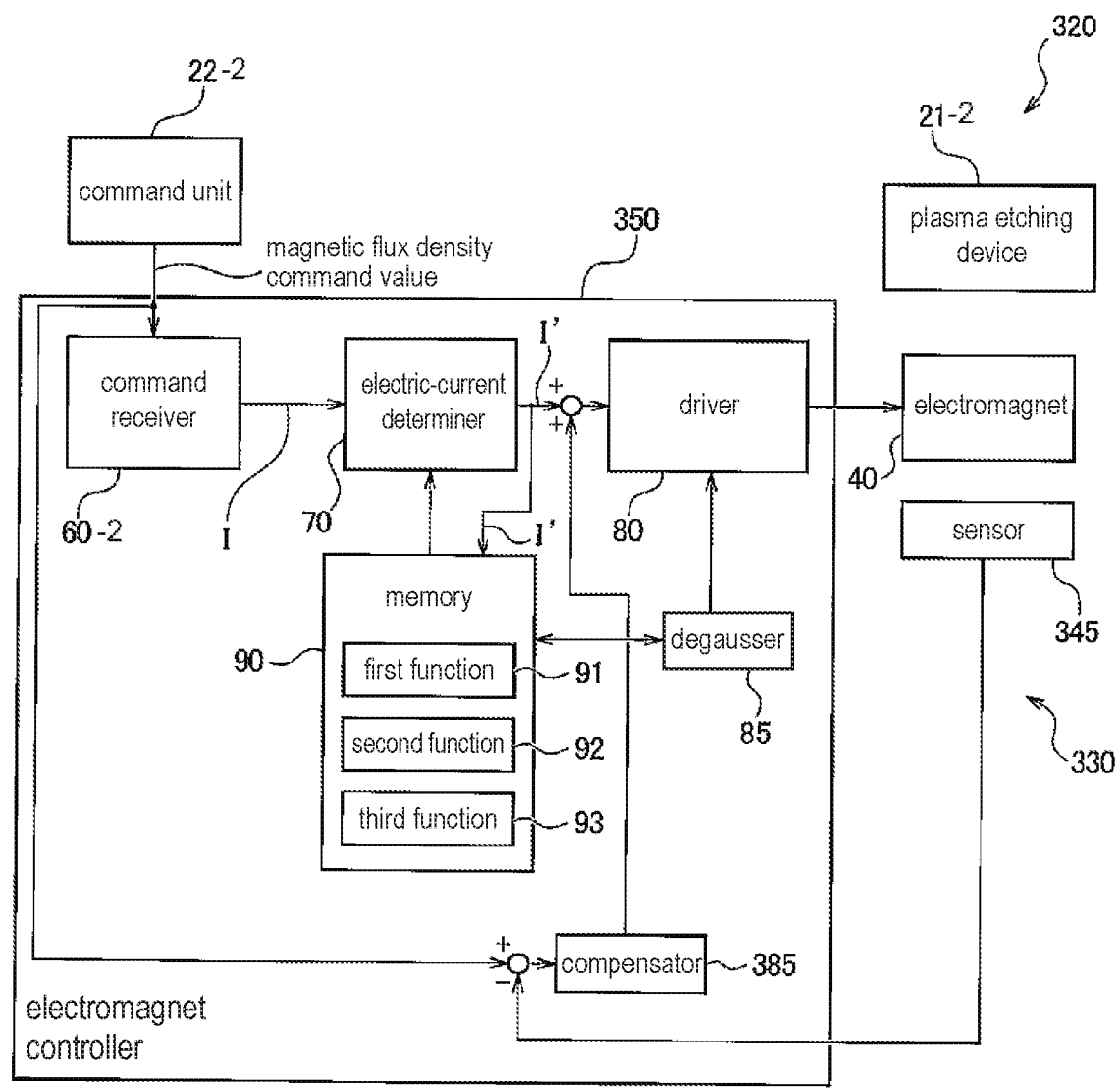
FIG. 30 is a block diagram of a schematic structure of a plasma etching system according to a seventh embodiment.

Moving on to the seventh embodiment of the present invention, FIG. 30 is a block diagram of a schematic structure of a plasma processing system 320 of the seventh embodiment. FIG. 30 uses the same reference numerals for elements corresponding to those of the fourth embodiment (see FIG. 14). Below, only the details of the plasma processing system 320 different from those of the fourth embodiment are described. As shown in FIG. 30, the plasma processing system 320 comprises an electromagnet system 330, instead of the electromagnet system 30-2. The electromagnet system 330 comprises an electromagnet 40-2, an electromagnet controller 350, and a sensor 345.

The sensor 345 detects the magnetic flux density of a magnetic field generated by a coil 41-2. In the case that the electromagnet 40-2 has a plurality of coils as in the fifth embodiment, the sensor 345 is provided for each coil. The sensors 345 may be provided at measurement points M1 to M4 of FIG. 24 or other locations. The sensor 345 may be placed, for example, within the iron core or a space in the chamber. In this case, the magnetic flux density values at measurement points M1 to M4 are estimated from values detected by the sensors 345. An electromagnet controller 350 comprises a compensator 385 in addition to a command receiver 60-2, an electric-current determiner 70, a driver 80, and memory 90. The compensator 385 compensates the controlled electric current value I' to reduce the difference between the magnetic flux density detected by the sensor 345 and the magnetic flux density command value input from the command unit 22-2 (ideally to near zero). An output from the compensator 385 is added to the controlled electric current value I', and this added value is input to the driver 80. This enable further improved precision control of magnetic flux density by feedback.

E. Modified Example

E-1. Modified Example 1

In the case of the above-described plasma processing systems 20-2, 320, a command value input from an external device (in this embodiment, the command unit 22-2) is not limited to a magnetic flux density command value. For example, the command unit 22-2 may convert a magnetic flux density command value to an electric current command value I that may in turn be input to the command receiver 60-2. Information received by the command receiver 60-2 may be anything that can be used to identify the magnetic flux density command value.

The functions 91, 92, 93 are not limited to functions representing the correspondence between the electric current command value I and the electric current correction amount $I_c$. The functions 91, 92, 93 may be ones that represent the correspondence of any parameters from which the controlled electric current value I' corresponding to the magnetic flux density command value can eventually be derived. For example, the functions 91, 92, 93 may represent the correspondence between magnetic flux density and voltage. Alternatively, the functions 91, 92, 93 may be ones that represent the relationship between magnetic flux density and current. In this case, the functions 91, 92, 93 may be ones that represent the relationship between the magnetic flux density command value and the electric current correction amount $I_c$. Alternatively, the functions 91, 92, 93 may be ones that represent the relationship between the magnetic flux density command value and the controlled electric current value I'. The use of functions that correlate magnetic flux density and current enables the controlled electric current value I' to be directly determined from a desired magnetic flux density without the need for conversion into other parameters. This leads to a reduction in operation load on the electromagnet controller 50-2.

E-2. Modified Example 2

The above-described plasma processing systems 20-2, 320 may be so configured that when the command receiver 60-2 has received a new magnetic flux density command value, the electric-current determiner 70 determines a value of electric current applied to a coil, using a function formulated by multiplying at least one of the terms of the first function 91, the second function 92, or the third function 93 by a predetermined coefficient, according to the breadth or amount of variation between the previously received magnetic flux density command value and the newly received magnetic flux density command value. In this case, the predetermined coefficient, preset on the basis of actual measurements, decreases with increasing amount of variation. The plasma processing system 320 may be so configured that when the command receiver 60-2 has received a new magnetic flux density command value, the electric current determiner 70 determines the values of electric currents flowing through the coils 241a to 241d, using a function formulated by working out at least the product or sum of the first function 91, the second function 92, or the third function 93 and a predetermined function, according to the amount of variation between the previously received magnetic flux density command value and the newly received magnetic flux density command value. The predetermined function is preset on the basis of actual measurements. This enables accurate control of magnetic flux density by setting a predetermined coefficient to reflect the variation of residual magnetic field with the amount of variation of magnetic flux density value (or electric current value).

The above-described embodiments incorporate at least the following technical concepts:

An electromagnet device according to a first aspect of the present invention is an electromagnet device used with a plasma processing device, comprising: a yoke having an annular groove in a front surface thereof; an annular coil provided in the groove; and a resin provided to enclose the coil therein and configured to secure the coil to the yoke and transfer heat, wherein there is a clearance between an outer circumferential surface of the groove in the yoke and the resin provided on an radially outer side of the coil.

An electromagnet device according to a second aspect of the invention is an electromagnet device of the first aspect having the coil accommodated in an interior of the groove.

An electromagnet device according to a third aspect of the present invention is an electromagnet device of the first or second aspect having the coil provided in the groove so that a central portion of the width of the coil is positioned radially inward of the center of the width of the groove.

An electromagnet device according to a fourth aspect of an embodiment of the present invention is an electromagnet device of any one of the first to third aspects having the coil provided in the groove so that a central portion of the depth of the coil is positioned closer to a bottom side than the center of the depth of the groove.

An electromagnet device according to a fifth embodiment of the present invention is an electromagnet device of any of the first to fourth embodiments, wherein the resin is a resin of good heat resistance and thermal conductivity.

An electromagnet device according to a sixth aspect of the present invention is an electromagnet device of any one of the first to fifth aspects, wherein the at least part of an inner circumferential surface of the groove has a tapered surface so formed that the width of the groove increases with increasing depth of the groove.

An electromagnet device according to a seventh aspect of the present invention is an electromagnet device of any one of the first to sixth aspects, further comprising wiring for energizing the coil, wherein the yoke has a through-hole passing through the interior of the groove and the rear surface side of the yoke, and the wiring passes through the through-hole.

An electromagnet device according to an eighth aspect of the present invention is an electromagnet device of any one of the first to seventh aspects, further comprising a cooling plate disposed on the rear side of the yoke.

An electromagnet device according to a ninth aspect of the present invention is an electromagnet device of the eighth aspect, further comprising a heat transfer sheet disposed between the rear surface of the yoke and the cooling plate.

The first to ninth aspects of the present invention provide an electromagnet device capable of controlling spatial magnetic field distribution accurately, while minimizing deformation of the yoke.

Further, the first to ninth aspects of the present invention provide a compact electromagnet device that saves energy (reduces heat from the coil).

An electromagnet controller according to a tenth aspect of the present invention is an electromagnet controller for controlling an electric current applied to an excitation coil of an electromagnet, comprising: a driver for applying electric current to the excitation coil; an electric-current value receiver for receiving an electric-current signal indicating a value of electric current flowing through the excitation coil; and an electric-current controller for controlling the electric current flowing through the excitation coil, wherein the electric-current controller comprises: an output voltage command calculator for calculating an output voltage command value for applying to the excitation coil an electric current having a target electric current value preset, based on a resistance value of the excitation coil; and an electric current difference calculator for calculating a difference in electric current between the target electric current value and an electric current value indicated by a signal received by the electric-current value receiver; and an adder for adding the electric-current difference to the output voltage command value, and wherein the electric-current controller is configured to transmit an output voltage command value having the electric-current difference added thereto to the driver.

An electromagnet controller according to an eleventh aspect of the present invention is an electromagnet controller of the tenth aspect of the present invention, wherein the electric-current controller has memory storing a resistance value of the excitation coil under certain conditions, and the output voltage command calculator calculates the output voltage command value, based on the resistance value stored in the memory.

An electromagnet controller according to a twelfth aspect of the present invention is an electromagnet controller of the tenth aspect of the present invention, further comprising an temperature receiver for receiving a signal indicating a temperature of the excitation coil, wherein the output voltage command calculator comprises a coil resistance calculator for calculating a resistance value of the excitation coil, based on a temperature of the excitation coil indicated by a signal received by the temperature receiver, and the output voltage command calculator calculates the output voltage command value, based on the resistance value of the excitation coil calculated by the coil resistance calculator.

An electromagnet controller according to a thirteenth aspect of the present invention is an electromagnet controller of the twelfth aspect of the present invention, further comprising a temperature detector for detecting a temperature of the excitation coil, the temperature detector being configured to transmit a signal indicating the detected temperature to the temperature receiver.

An electromagnet controller according to a fourteenth aspect of the present invention is an electromagnet controller of any one of the tenth to thirteenth aspects of the present invention, further comprising an electric current detector for detecting a value of electric current flowing through the excitation coil, the electric current detector being configured to transmit a signal indicating the detected electric current value to the electric-current value receiver.

An electromagnet according to a fifteenth aspect of the present invention is an electromagnet controlled by the electromagnet controller of any one of the tenth to fourteenth aspects of the present invention.

An electromagnet control method according to a sixteenth aspect of the present invention is an electromagnet control method for controlling electric current applied to an excitation coil of an electromagnet, comprising: calculating an output voltage command value for applying an electric current of target electric current value to the excitation coil, based on a resistance value of the excitation coil; applying electric current to the excitation coil, based on the output voltage command value calculated; deriving a signal indicating the value of electric current flowing through the excitation coil; calculating a difference in electric current between the target electric current value and the electric current value indicated by the signal derived; adding the difference in electric current to the output voltage command value calculated; and applying electric current to the excitation coil, based on the output voltage command value having the difference in electric current added thereto.

An electromagnet control method according to a seventeenth aspect of the present invention is an electromagnet control method of the sixteenth aspect, wherein calculating the output voltage command value is based on the resistance value of the excitation coil under predetermined conditions.

An electromagnet control method of an eighteenth aspect of the present invention is an electromagnet control method of the sixteenth aspect comprising: deriving a signal indicating a temperature of the excitation coil; and calculating the resistance value of the excitation coil, based on the temperature of the excitation coil indicated by the signal derived, wherein calculating the output voltage command value is based on the resistance value of the excitation coil calculated.

According to the electromagnet controllers, the electromagnet, or the electromagnet control method of the tenth to eighteenth aspects of the present invention, it is possible to provide an electromagnet controller and an electromagnet control method that bring the electric current flowing through the electromagnet toward the commanded value.

According to the tenth to eighteenth aspects of the present invention, the electromagnet controller, the electromagnet, or the electromagnet control method, the output voltage command value for applying to the excitation coil an electric current of target electric current value preset is calculated based on the resistance value of the excitation coil, and the output voltage command value is transmitted to the driver. This makes it possible to reduce the time required to reach the target electric current value and improve control precision over the prior art (reduce the difference between the target electric current value and the actual electric current value). It is also possible to reduce the cost of the controller, since there is no need to use a high-precision A/D converter or D/A converter.

According to the tenth to eighteenth aspects of the present invention, the electromagnet controller, the electromagnet, or the electromagnet control method, a signal indicating the temperature of the excitation coil is obtained. This enables to estimate the resistance value of the excitation coil, an object under control, accurately even when the temperature causes the resistance value to vary greatly, resulting in accurate control of the electric current applied to the excitation coil.

The nineteenth aspect of the present invention is to provide an electromagnet controller for controlling an electric current flowing through a coil of an electromagnet comprising a yoke and the coil. This electromagnet controller comprises: a command receiver configured to receive a magnetic flux density command value corresponding to a command value for a target magnetic flux density obtained by application of electric current to the coil or information from which the magnetic flux density command value can be identified; and an electric-current determiner configured to determine a value of electric current flowing through the coil, based on the magnetic flux density command value. The electric-current determiner performs a first process of determining a value of electric current flowing through the coil, based on a first function, to increase the absolute value of a magnetic flux density from the degaussed state of the yoke, a second process of determining a value of electric current flowing through the coil, based on a second function, to decrease the absolute value of the magnetic flux density from the magnetized state of the yoke, and a third process of determining a value of electric current flowing through the coil, based on a third function, to increase the absolute value of the magnetic flux density from the magnetized state of the yoke.

This electromagnet controller selectively uses the three functions, according to history of electric-current application, to control the electric current flowing through the coil. This makes it possible, regardless of the history of electric-current application, to reduce the effect of residual magnetic field resulting from hysteresis and bring a magnetic flux density command value and an actual magnetic flux density value caused by electric current application to the coil into conformity more accurately than the prior art. This in turn makes it possible to improve the reproducibility of process use conditions with identical plasma processing devices with which the electromagnet controller is used and reduce performance differences between individual plasma processing devices having identical specifications. Further, regardless of the degree of hysteresis of the yoke, it is possible to bring a magnetic flux density command value and an actual magnetic flux density value into conformity with improved accuracy. This eliminates the need for using a material of low hysteresis with low hysteresis for the yoke. As a result, a readily available inexpensive material can be used for the yoke. In other words, the cost of the electromagnet controller and the time required from ordering to receipt of the electromagnet controller can be reduced.

According to a twentieth aspect of the present invention, an electromagnet controller in the nineteenth aspect uses the first, second, and third functions that represent the relationship between magnetic flux density and electric current. This eliminates the need for conversion into another parameter and enables the electric current flowing through the coil to be determined directly from a desired magnetic flux density. As a result, operation load on the electromagnet controller can be reduced.

According to a twenty-first aspect of the present invention, a electromagnet controller according to the nineteenth or twentieth aspect uses the first, second, and third functions that are linear ones. This makes it possible to determine an electric current value by taking a hysteresis characteristic into account, based on hysteresis characteristic linear approximation. As a result, accurate control of magnetic flux density within a certain tolerance can be achieved without extensive numerical analysis for minor loop calculations.

According to a twenty-second aspect of the present invention, an electromagnet controller according to the twenty-first aspect uses the linear functions that are piecewise linear functions. This makes it possible to control magnetic flux density more accurately than the third embodiment, without the need for extensive numeral analysis.

According to a twenty-third aspect of the present invention, an electromagnet controller according to any one of the nineteenth to twenty-second aspects further comprises a degausser for degaussing the yoke. This makes it possible to increase the frequency of determination of electric current flowing through the coil, based on the first function, after degaussing. Since the determination of electric current value in degaussed state is simpler than that in magnetized state, operation load on the electromagnet controller can be reduced.

According to a twenty-fourth aspect of the present invention, an electromagnet controller according to any one of the nineteenth to twenty-third aspects is configured so that in switching from the first to the second process of determining the value of electric current flowing through the coil, from the second to the third, or from the third to the second, the electric-current determiner determines the value of electric current flowing through the coil, according to the electric current value at the time of switching, using a function formulated by multiplying by a predetermined coefficient at least one of the terms of one of the first, second, and third functions corresponding to the process after switching. This makes it possible to bring a magnetic flux density command value and an actual magnetic flux density caused by electric current application to the coil into conformity with accuracy, according to history of electric current application, using a simple technique. This reduces operation load on the electromagnet controller.

According to a twenty-fifth aspect of the present invention, an electromagnet controller according to any one of the nineteenth to twenty-fourth aspects is configured so that when the command receiver has received a new magnetic flux density command value, the electric-current determiner determines the value of electric current flowing through the coil, using a function formulated by multiplying by a predetermined coefficient at least one of the terms of the first, second, or third function, according to the amount of variation between the previously received magnetic flux density command value and the newly received magnetic flux density command value. This makes it possible to control magnetic flux density with accuracy by set up a coefficient to reflect the variation of residual magnetic field that depends on the amount of variation of magnetic flux density (or electric current).

According to a twenty-sixth aspect, an electromagnet controller according to any one of the nineteenth to twenty-fifth aspects further comprises a plurality of coils. The electric-current determiner is configured to determine the value of electric current flowing through the coils by taking into account the effect of magnetic fields generated by the plurality of coils. This make it possible to achieve precise control of magnetic flux density with the electromagnet having a plurality of coils. The plurality of coils may be arranged to form identical or different flux paths.

According to a twenty-seventh aspect of the present invention, an electromagnet controller according to the twenty-sixth aspect is configured so that when the command receiver has received a new magnetic flux density command value, the electric-current determiner determines the value of electric current flowing through the coil, using a function formulated by multiplying at least one of the terms of the first, second or third function by a predetermined coefficient or multiplying and/or adding the first, second, or third function by and/or to a certain function, according to the amount of variation between the previously received magnetic flux density command value and the newly received magnetic flux density command value. This brings about a similar effect to that of the electromagnet controller according to the twenty-fifth embodiment, using the electromagnet having a plurality of coils.

According to a twenty-eighth aspect of the present invention, an electromagnet controller according to the twenty-sixth or twenty-seventy aspect is configured so that in the case that at least two of a plurality of coils form identical flux paths, the electric-current determiner corrects the electric current flowing through the coils by multiplying by a predetermined function or coefficient the electric current value determined on the basis of the first, second, or third function. This makes it possible to achieve accurate control of magnetic flux density by taking into account mutual interference caused by the identical flux paths of at least two of the plurality of coils.

According to a twenty-ninth aspect of the present invention, an electromagnet system comprises the electromagnet controller according to any one of the nineteenth to twenty-eighth embodiments and an electromagnet. This electromagnet system brings about a similar effect to that of the electromagnet controller according to any one of the nineteenth to twenty-eighth aspects.

According to a thirtieth aspect of the present invention, an electromagnet system according to the twenty-ninth embodiment comprises a sensor for detecting the magnetic flux density of magnetic field generated by a coil and a compensator for correcting the electric current flowing through the coil, based on the difference between a magnetic flux density detected by the sensor and a magnetic flux density command value, to reduce the difference. This makes it possible to control the magnetic flux density with improved accuracy by feedback.

The present invention is not limited to the above embodiments and can be carried out in various forms, such as an electromagnet control method, a program for electromagnet control, and a storage medium storing such a program in a computer-readable form.

The embodiments of the present invention described above are intended to facilitate understanding of the present invention and not to limit the present invention. Various modifications and improvements are possible without departing the spirit of the present invention, and the scope of the present invention encompasses its equivalents. Provided that the above-described problem can be solved at least to some extent or that the effect can be achieved at least in part, it is possible to combine the constituent elements recited in the claims and the specification in any way or to omit some of them.

The present application claims priority to Japanese Patent Application No. 2015-096248, filed on May 11, 2015, Japanese Patent Application No. 2015-108160, filed on May 28, 2015, and Japanese Patent Application No. 2015-210872, filed on Oct. 27, 2015. The entire disclosures in the specifications, claims, drawings, and abstract attached to Japanese Patent Application No. 2015-096248, Japanese Patent Application No. 2015-108160, and Japanese Patent Application No. 2015-210872 are incorporated by reference into the present application. The entire disclosures in the specifications, claims, drawings, and abstract in JP-A-2013-149722 (Patent Literature 1), JP-A-2012-74972 (Patent Literature 2), and JP-A-2007-132902 (Patent Literature 3) are also incorporated by reference into the present application.

REFERENCE SIGNS LIST 10. plasma processing device
20. electromagnet device
21. yoke
22a, 22b, 22c, 22d. grooves
23a, 23b, 23c, 23d. coils
24a, 24b, 24c, 24d. epoxy resins
27a, 27b, 27c, 27d. clearances
28a, 28b, 28c, 28d. through-holes
29. release agent
40. cooling plate
44a, 44b. tapered surface
45. heat transfer plate
52a, 52b. first wiring
53a, 53b. second wiring
11-1. electromagnet device
20-1. controller
21-1. output voltage command calculator
22-1. electric-current difference calculator
23-1. memory
28-1. coil resistance calculator
29-1. adder
30-1. CPU electric-current controller
33-1. amplifier
35-1. amplifier
37-1. amplifier
40-1. excitation coil
41-1. temperature detector
42-1. electric-current detector
20-1, 320. plasma processing system
21-2. plasma etching device
22-2. command unit
30-2, 330. electromagnet system
40-2, 240. electromagnet
41-2, 241a, 241b, 241c, 241d. coils
42-2, 242. yoke
50-2, 350. electromagnet controller
60-2. command receiver
70. electric-current determiner
80. driver
85. degausser
90. memory
91. first function
92. second function
93. third function
345. sensor
385. compensator

What is claimed is:
1. A plasma processing device, comprising:
a chamber;
a substrate stage placed in the chamber and provided thereon with the substrate;
an electromagnet device on top of the chamber; and
a controller for controlling the electromagnet device,
wherein the electromagnet device comprises:
a yoke having a disc-shaped back yoke with a plurality of annular grooves of different diameters formed on a front surface of the back yoke, the front surface facing the substrate, each annular groove including an inner circumferential surface and an outer circumferential surface;
a plurality of annular coils provided in the plurality of annular grooves, each annular coil being wound around the inner circumferential surface of each annular groove of a different diameter; and
a resin provided to enclose each annular coil therein and configured to secure each annular coil to the yoke and transfer heat, wherein
there is a clearance between the resin provided on a radially outer side of each annular coil and the outer circumferential surface of each annular groove in the yoke, by which clearance the resin is apart from an entirety of the outer circumferential surface of each annular groove in the yoke,
wirings for energizing each annular coil are disposed on the rear side of the yoke opposite to the front surface, and
the back yoke of the yoke has through-holes, each through-hole passing through the interior of each annu- lar groove and the rear side of the back yoke, each wiring passes through each through-hole.

2. A plasma processing device according to claim 1, wherein each annular coil is accommodated in an interior of each annular groove.

3. A plasma processing device according to claim 1, wherein each annular coil is provided in each annular groove so that a central portion of a width of each annular coil is positioned radially inward of a center of a width of each annular groove.

4. A plasma processing device according to claim 1, wherein each annular coil is provided in each annular groove so that a central portion of a depth of the coil is positioned closer to a bottom side than a center of a depth of each annular groove.

5. A plasma processing device according to claim 1, wherein the resin is a resin of good heat resistance and thermal conductivity.

6. A plasma processing device according to claim 1, wherein at least part of an inner circumferential surface of each annular groove has a tapered surface so formed that the width of each annular groove increases with increasing depth of each annular groove.

7. A plasma processing device according to claim 1, further comprising a cooling plate disposed on a rear side of the yoke.

8. A plasma processing device according to claim 7, further comprising a heat transfer sheet disposed between a rear surface of the yoke and the cooling plate.

* * * * *